US010096733B2

(12) United States Patent
Kagan et al.

(10) Patent No.: US 10,096,733 B2
(45) Date of Patent: Oct. 9, 2018

(54) METHODS FOR THE PREPARATION OF COLLOIDAL NANOCRYSTAL DISPERSION

(71) Applicant: THE TRUSTEES OF THE UNIVERSITY OF PENNSYLVANIA, Philadelphia, PA (US)

(72) Inventors: Cherie R. Kagan, Bala-Cynwyd, PA (US); Aaron T. Fafarman, Philadelphia, PA (US); Ji-Hyuk Choi, Philadelphia, PA (US); Weon-Kyu Koh, Los Alamos, NM (US); David K. Kim, Lincoln, MA (US); Soong Ju Oh, Philadelphia, PA (US); Yuming Lai, Philadelphia, PA (US); Sung-Hoon Hong, Daejeon (KR); Sangameshwar Rao Saudari, Fishkill, NY (US); Christopher B. Murray, Bala Cynwyd, PA (US)

(73) Assignee: The Trustees of the University of Pennsylvania, Philadelphia, PA (US)

( * ) Notice: Subject to any disclaimer, the term of this patent is extended or adjusted under 35 U.S.C. 154(b) by 198 days.

(21) Appl. No.: 15/150,816

(22) Filed: May 10, 2016

(65) Prior Publication Data
US 2016/0336087 A1     Nov. 17, 2016

Related U.S. Application Data

(62) Division of application No. 13/969,863, filed on Aug. 19, 2013, now Pat. No. 9,336,919.
(Continued)

(51) Int. Cl.
*H01B 1/06* (2006.01)
*B05D 1/18* (2006.01)
(Continued)

(52) U.S. Cl.
CPC .............. *H01L 31/07* (2013.01); *B82Y 10/00* (2013.01); *B82Y 40/00* (2013.01); *H01B 1/06* (2013.01);
(Continued)

(58) Field of Classification Search
CPC .................................... H01B 1/06; B05D 1/18
See application file for complete search history.

(56) References Cited

U.S. PATENT DOCUMENTS 5,559,057 A * 9/1996 Goldstein ......... H01L 21/02425
216/40
6,139,626 A 10/2000 Norris et al.
(Continued)

FOREIGN PATENT DOCUMENTS

| EP | 2442364 | | 4/2014 |
|---|---|---|---|
| JP | 2000-256418 | * | 9/2000 |
| JP | 2000256418 A | | 9/2000 |

OTHER PUBLICATIONS

Kovalenko, Maksym V., et al., "Colloidal Nanocrystals with Molecular Metal Chalcogenide Surface Ligands". Science, vol. 324, Jun. 12, 2009, pp. 1417-1421.*
(Continued)

*Primary Examiner* — Bret P Chen
(74) *Attorney, Agent, or Firm* — RatnerPrestia

(57) ABSTRACT

Methods of preparing a dispersion of colloidal nanocrystals (NCs) for use as NC thin films are disclosed. A dispersion of NCs capped with ligands may be mixed with a solution containing chalcogenocyanate (xCN)-based ligands. The mixture may be separated into a supernatant and a flocculate. The flocculate may be dispersed with a solvent to form a subsequent dispersion of NCs capped with xCN-based ligands.

13 Claims, 13 Drawing Sheets

Related U.S. Application Data

(60) Provisional application No. 61/754,248, filed on Jan. 18, 2013, provisional application No. 61/684,425, filed on Aug. 17, 2012.

(51) Int. Cl.

| | |
|---|---|
| H01L 31/07 | (2012.01) |
| H01L 29/06 | (2006.01) |
| B82Y 10/00 | (2011.01) |
| B82Y 40/00 | (2011.01) |
| H01L 29/41 | (2006.01) |
| H01L 29/786 | (2006.01) |
| H01L 31/032 | (2006.01) |
| H01L 29/22 | (2006.01) |
| H01L 29/24 | (2006.01) |
| H01L 29/45 | (2006.01) |
| H01L 29/49 | (2006.01) |
| H01L 29/66 | (2006.01) |
| H01L 31/18 | (2006.01) |
| H01L 29/12 | (2006.01) |
| H01L 29/18 | (2006.01) |
| B82Y 20/00 | (2011.01) |

(52) U.S. Cl.
CPC .......... *H01L 29/0665* (2013.01); *H01L 29/22* (2013.01); *H01L 29/2203* (2013.01); *H01L 29/24* (2013.01); *H01L 29/413* (2013.01); *H01L 29/45* (2013.01); *H01L 29/4908* (2013.01); *H01L 29/66969* (2013.01); *H01L 29/78603* (2013.01); *H01L 29/78681* (2013.01); *H01L 31/0324* (2013.01); *H01L 31/18* (2013.01); *B82Y 20/00* (2013.01); *H01L 29/127* (2013.01); *H01L 29/18* (2013.01); *Y02E 10/50* (2013.01); *Y10S 977/891* (2013.01); *Y10S 977/938* (2013.01); *Y10S 977/954* (2013.01)

(56) References Cited

U.S. PATENT DOCUMENTS

| | | | |
|---|---|---|---|
| 6,268,041 B1 | 7/2001 | Goldstein | |
| 6,365,969 B1 | 4/2002 | Yamaguchi et al. | |
| 6,811,957 B1 | 11/2004 | Mau | |
| 7,957,621 B2* | 6/2011 | Zhang | B82Y 20/00 257/E33.074 |
| 9,123,538 B2 | 9/2015 | Wheeler et al. | |
| 2005/0238568 A1* | 10/2005 | Yu | B82Y 30/00 423/508 |
| 2007/0040191 A1 | 2/2007 | Bezryadin et al. | |
| 2007/0116638 A1 | 5/2007 | Petruska et al. | |
| 2007/0227578 A1* | 10/2007 | Perozziello | H01L 31/0322 136/244 |
| 2008/0044964 A1 | 2/2008 | Kamath | |
| 2009/0061226 A1 | 3/2009 | Banin et al. | |
| 2010/0025595 A1 | 2/2010 | Bawendi | |
| 2010/0055462 A1 | 3/2010 | Cao | |
| 2010/0224823 A1 | 9/2010 | Yin et al. | |
| 2010/0264403 A1 | 10/2010 | Sirringhaus et al. | |
| 2011/0097879 A1 | 4/2011 | Reiss et al. | |
| 2012/0205598 A1* | 8/2012 | Li | C09K 11/565 252/519.34 |
| 2012/0261624 A1 | 10/2012 | Peng | |
| 2014/0050851 A1 | 2/2014 | Kagan et al. | |
| 2015/0214376 A1 | 7/2015 | Koezuka et al. | |
| 2015/0364324 A1* | 12/2015 | Kagan | H01L 29/0665 257/629 |

OTHER PUBLICATIONS

Wise, Frank, "Colloidal Nanocrystals: Virtues of defects". Nature Materials, vol. 17, Jan. 2018, pp. 8-9.*

Van Embden, Joel, et al., "Evolution of Colloidal Nanocrystals: Theory and Modeling of their Nucleation and Growth". J. Phys. Chem. C 2009, 113, 16342-16355.*

Parak, Wolfgang J., et al., "Biological applications of colloidal nanocrystals". Nanotechnology, 14 (2003) R15-R27.*

Singh, Nanhai, et al., "New heterometallic coordination polymers derived from chalcogenocyanates: synthesis, characterization and electrical properties". Transition Metal Chemistry 29: 812-820, 2004.*

Singh, Nanhai, et al., "Synthesis, characerization and electrical conductivities of mixed-ligand (N, S/Se) heterobimetallic coodiation polymers and their 12-doped products". Indian Journal of Chemistry, vol. 47A, May 2008, pp. 650-656.*

U.S. Final Office Action for U.S. Appl. No. 14/761,799, dated Oct. 18, 2016, 13 pages.

Kovalenko, Maksym V., et al., "Colloidal Nanocrystals with Molecular Metal Chalcogenide Surface Ligands", Science, vol. 324, Jne 12, 2009, pp. 1417-1421.

Yin, Yodong, et al., "Colloidal nanocrystal synthesis and the organic-inorganic interface", Nature, vol. 437, Sep. 29, 2005, pp. 664-670.

Singh, Nanhai, et al., "Synthesis, characterization and electrical conductives of mixed-ligand (N, S/Se) heterobimetallic coordination of polymers and their 12-doped products", Indian Journal of Chemistry, vol. 47A, May 2008, pp. 650-656.

International Search report and Written Opinion for PCT/US2014/012023, dated Aug. 13, 2014, 7 pages.

Oh et al.m, "Stoichiometric Control of Lead Chalcogenide Nanocrystal Solids to Enhance Their Electronic and Optoelectronic Device Performance," American Chemical Society NANO Letters, Dec. 12, 2012, 9 pages.

Koh et al., "Thiocyanate-Capped PbS Nanocubes: Ambipolar Transport Enables Quantum Dot Based Circuits on a Flexible Substrate," ACS Nano Lett., Oct. 19, 2011, pp. 4764-4767.

Fafarman et al., "Thiocyanate-Capped Nanocrystal Colloids" Vibrational Reproter of Surface Chemistry and Solution-Based Route to Enhanced Coupling in Nanocrystal Solids, Journal of the American Chemical Society, 2011, vol. 133, pp. 15753-15761.

Choi et al., "Bandlike Transport in Strongly Coupled and Doped Quantum Dot Solids: A Route to High-Performance Thin-Film Electronics,", American Chemical Society, 2012, vol. 12, pp. 2631-2638.

Fafarman et al., "Air-Stable, Nanostructured Electronic and Plasmonic Materials from Solution-Processable, Silver Nanocrystal Building Blocks", ACS Nano, 2014, vol. 8, No. 3, pp. 2746-2754.

Fafarman et al., "Chemically Tailored Dielectric-to-Metal Transition for the Design of Metamaterials from Nanoimprinted Colloidal Nanocrystals", ACS Publications, Nano Letters, 2013, vol. 13, pp. 350-357.

Kim et al., "Flexible and low-voltage integrated circuits constructed from high-performance nanocrystal transistors", Nature Communications, 2012, pp. 1-6.

Non Final Office Action for U.S. Appl. No. 13/969,863, dated Jul. 30, 2015, 8 pages.

Notice of Allowance for U.S. Appl. No. 13/969,863, dated Jan. 12, 2016, 7 pages.

Notice of Allowance for U.S. Appl. No. 14/761,799, dated Sep. 15, 2017, 12 pages.

Gorshkov et al., "Models of Synthesis of Unifrom Colloids nad Nanocrystals", 37 pages.

Junghanns et al., "Nanocrystal Technology, Drug Delivery and Clinical Applications", International Journal of Nanomedicine, 2008, vol. 3, No. 3, pp. 295-309.

Chang et al., "Colloidal Semiconductor Nanocrystals: Controlled Synthesis and Surface Chemistry in Organic Media", RSC Advances, 2014, No. 4, pp. 23505-23527.

Yin et al., "Colloidal nanocrystal Synthesis and the Organic-Inorganic Interface", 27 pages.

Notice of Allowance for U.S. Appl. No. 15/150,824, dated Jun. 7, 2018, 22 pages.

* cited by examiner

METHODS FOR THE PREPARATION OF COLLOIDAL NANOCRYSTAL DISPERSION

CROSS-REFERENCE TO RELATED APPLICATIONS is This patent application is a divisional patent application of U.S. patent application Ser. No. 13/969,863, filed Aug. 19, 2013, which claims priority to U.S. Provisional Patent Application No. 61/754,248, filed Jan. 18, 2013, and U.S. Provisional Patent Application No. 61/684,425, filed Aug. 17, 2012, each of which is incorporated herein by reference in its entirety for all purposes.

STATEMENT REGARDING FEDERALLY SPONSORED RESEARCH

Aspects of this invention were made with government support under one or more of: contract number DMS-0935165 awarded by the National Science Foundation (NSF) Solar Program; under contract number DE-SC0002158 awarded by the U.S. Department of Energy Office of Basic Energy Sciences, Division of Materials Science and Engineering; under contract number ONR-N00014-10-1-0942 awarded by the Office of Naval Researched MURI Program; under contract number CBET-0854226 awarded by NSF-CBET; and under contract number DMR11-20901 awarded by the NSF. The government has rights in this invention.

FIELD OF THE INVENTION

The invention relates to the field of colloidal nanocrystal-based thin films and solutions.

BACKGROUND OF THE INVENTION

Quantum dots (QDs) or colloidal nanocrystals (NCs) are of particular interest for their size-tunable and shape-tunable optical, electrical, and magnetic properties as well as their propensity to self-assemble from solution into nanostructured solids. To control the NC growth and to stabilize NC dispersions in solution, organic surfactants, or ligands, are used. These NCs can be formed into thin films used in the construction of electronics and optoelectronics. Doping of NC thin films is of particular interest in the field of semiconductor nanocrystals due to the challenges it has presented.

SUMMARY OF THE INVENTION

The inventors have recognized that when NCs are assembled into NC solids, the relatively long, bulky ligands typically used to control the NC growth prevent strong interparticle coupling desirable for device application. Aspects of the invention replace the ligands typically found in NC solids with chalcogenocyanate-based ligands, e.g., for use in thin-film based electronics, optoelectronics, and photonics.

Aspects of the invention are embodied in methods of exchanging ligands to form a colloidal nanocrystal-based (NC) thin film with chalcogenocyanate (xCN)-based ligands and apparatuses comprising NC thin film(s) with xCN-based ligands. The ligands may also be exchanged by assembling NCs into a thin film and immersing the thin film in a solution containing xCN-based ligands. The ligands may be exchanged by mixing a xCN-based solution with a dispersion of NCs, flocculating the mixture, centrifuging the mixture, discarding the supernatant, adding a solvent to the pellet, and dispersing the solvent and pellet to form dispersed NCs with exchanged xCN-ligands. The NCs with xCN-based ligands may be used or further processed to form thin film electronic, optoelectronic, photonic, and/or other devices.

Other aspects of the invention are embodied in controlling free carrier concentration through surface passivation and doping by evaporation and thermal diffusion of metal on NC thin film electronic, optoelectronic, photonic, and/or other devices. The doping method of evaporation and facile thermal diffusion of a dopant metal has never previously been applied to nanocrystal-based materials. The use of xCN-based ligands is ideal as it is short, inorganic, non-corrosive, environmentally benign and easily produced. The combination of the general applicability of xCN-based ligand exchange along with the doping NC-based thin films by evaporation and thermal diffusion enables widespread implementation of solution-processed, low-cost, large-area, high-performance NC-based thin film devices.

BRIEF DESCRIPTION OF THE DRAWINGS

The invention is best understood from the following detailed description when read in connection with the accompanying drawings, with like elements having the same reference numerals. This emphasizes that according to common practice, the various features of the drawings are not drawn to scale. On the contrary, the dimensions of the various features are arbitrarily expanded or reduced for clarity. Included in the drawings are the following figures.

DETAILED DESCRIPTION OF THE INVENTION

Figure 1:
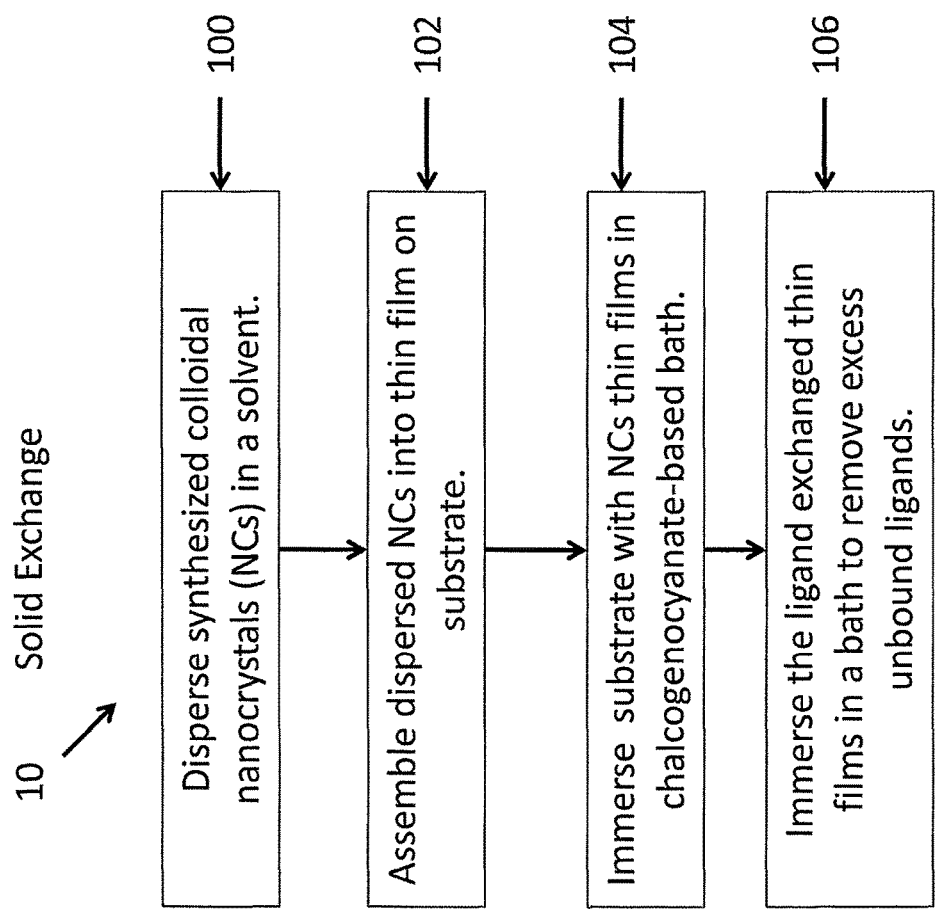
FIG. 1 is a flowchart depicting chalcogenocyanate-based ligand solid exchange in accordance with aspects of the invention.

FIG. 1 is a flowchart 10 of exemplary steps for exchanging ligands in a colloidal nanocrystal (NC)-based thin film with chalcogenocyanate (xCN)-based ligands. Such structures are useful for forming thin film electronics, optoelectronics, and/or photonics, for example. As used herein, the term "chalcogenocyanate-based" refers to materials or molecular compounds that include cyanate (OCN), thiocyanate (SCN), selenocyanate (SeCN), tellurocyanate (TeCN), quaternary ammonium salts (e.g., tetramethyl ammonium), etc. (e.g., NH4SCN, KSCN, NR4SCH where R is an alkyl group, etc.).

At block 100, synthesized NCs are dispersed. The NCs may be dispersed in a solvent (e.g. hexanes, octanes, etc.). The NCs may be cadmium based (e.g., CdS, CdSe, CdTe, CdO), zinc based (e.g., ZnS, ZnSe, ZnTe), nickel or iron based (e.g., Ni, Fe, NiFe), gold based (e.g., AuAg, AuPt), silver based (Ag), bismuth based (e.g., Bi), and/or lead based (e.g., PbS, PbSe, PbTe). The NCs may have various structures (e.g. cubical, spherical, core/shell, alloy, etc.) and various sizes. Other suitable dispersion solvents, NC compositions/alloys, and structures will be understood by one of skill in the art from the description herein.

At block 102, the dispersed NCs are assembled into one or more thin films. To assemble the one or more thin films, the NCs may be deposited (e.g. drop-cast, spin-coat, dip-coat, printed, etc.) on a substrate and, if desired, repeated to form additional thin films. The substrate may be sapphire, glass, quartz, and/or polished silicon. In one embodiment, the substrate is flexible (e.g., polyimide, LDPE, PDMS). Other suitable substrates to assemble NCs into thin film(s) will be understood by one of skill in the art. In embodiments where the substrate is glass or silicon, at least one silane layer may be assembled on the substrate to prevent delamination of NC film(s). The silane layer may be (3-mercaptopropyl)-trimethoxysilane (MPTS) or other types of silane layers suitable for use to prevent delamination of the NC film(s). In one embodiment, after the NC film(s) are assembled, the film(s) are immersed in a solution to remove non-specifically bound ligands from the film(s). The solution may be a 2-propanol solution. In a particular embodiment, the film(s) are immersed in the 2-propanol solution for about 10 minutes.

At block 104, the ligands in the NC film(s) are exchanged with chalcogenocyanate-based ligands. The ligands may be exchanged by immersing the NC film(s) in a solution containing chalcogenocyanates, such as SCN, OCN, SeCN, TeCN, etc. The solution may contain ammonium-thiocyanate (NH4SCN) or potassium thiocyanate (KSCN). In a particular embodiment, the solution comprises between about 100 mM and about 250 mM of NH4SCN in acetone or methanol and the NC film(s) are immersed in the solution for about 1-2 minutes. In an exemplary embodiment, the solution comprises about 130 mM of NH4SCN in acetone.

At block 106, the NC film(s) with the exchanged chalcogenocyanate-based ligands are immersed in a bath to remove excess unbound ligands. The bath may be pure acetone or methanol. In one embodiment, the NC film(s) are immersed in the bath for about one minute. In another embodiment, the NC film(s) are immersed in successive baths.

Figure 2:
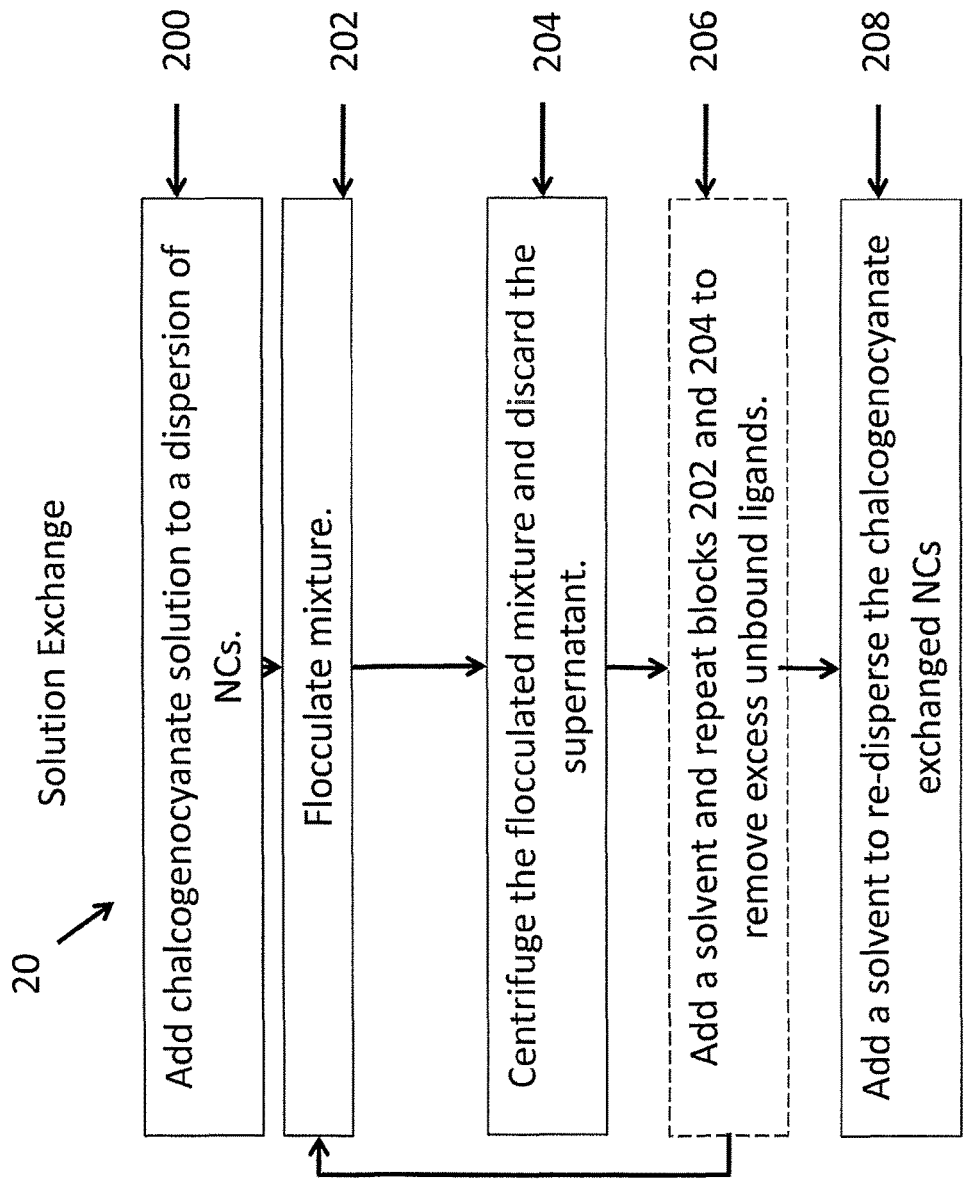
FIG. 2 is a flowchart depicting chalcogenocyanate-based ligand solution exchange in accordance with aspects of the invention.

FIG. 2 is a flowchart 20 of exemplary steps for exchanging ligands in a synthesized NC solution to form an NC dispersed solution with exchanged ligands. Such solutions are useful, for example, as solutions to be formed into thin films for thin film based electronics, optoelectronics, and photonics. The NCs may be cadmium based (e.g., CdS, CdSe, CdTe), zinc based (e.g., ZnS, ZnSe, ZnTe), nickel based (e.g., NiFe), gold based, silver based, bismuth based, and/or lead based (e.g., PbS, PbSe, PbTe). Other suitable NC compositions, alloys and core/shells will be understood by one of skill in the art from the description herein. All steps of flowchart 20 may be performed in a nitrogen atmosphere.

At block 200, a chalcogenocyanate-based solution is added to a dispersion of synthesized NCs. The synthesized NCs may be dispersed in a solvent (e.g., hexanes, octanes, etc.) In one embodiment, the chalcogenocyanate-based solution contains between about 100 mM and about 250 mM of NH4SCN in acetone. In an exemplary embodiment, about 0.5 mL of 130 mM NH4SCN in acetone is added to an about 1 mL dispersion of synthesized NCs.

At block 202, the mixture of the chalcogenocyanate-based solution and the synthesized NCs is flocculated. To achieve flocculation, the mixture may be agitated or stirred. In one embodiment, the mixture is agitated for about one minute. In an alternative embodiment, the mixture is stirred in a vortexing mixer. In an exemplary embodiment, the mixture is stirred in a vortexing mixer at about 3000 rpm for about 1-2 minutes. Other suitable techniques for achieving flocculation of the mixture will be understood by one of skill in the art from the description herein.

At block 204, the flocculated mixture is centrifuged until separation of a supernatant and a pellet, with the separated supernatant being discarded. The flocculated mixture may be centrifuged between about 2000×g and about 3000×g. In a particular embodiment, the flocculated mixture is centrifuged for about 1 minute.

At block 206, a solvent is added to the pellet to wash the pellet and the steps described in blocks 202 and 204 are repeated until a desired exchange of ligands has occurred. In an exemplary embodiment, the solvent is a non-dispersing solvent. Solvents that may be added include acetone, tetrahydrofuran, and/or toluene. Other suitable solvents will be understood by one of skill in the art. Flocculation of the resulting slurry may be achieved utilizing the flocculation at block 202. Separation of a supernatant and a pellet may be achieved utilizing the centrifuging at block 204. After separation of a supernatant and a pellet, the supernatant is discarded.

At block 208, the NCs become substantially dispersed. Dispersion of the NCs may be achieved by adding a solvent to the pellet and agitating the mixture. In a particular embodiment, the added solvent is a dispersing solvent. The added solvent may be dimethyl sulfoxide (DMSO), dimethylformamide (DMF), n-methyl pyrollidinone (NMP) and/or dimethyl amide (DMA). Particular embodiments of the solution ligand exchange of flowchart 20 are disclosed in the "EXAMPLES" section.

Figure 3:
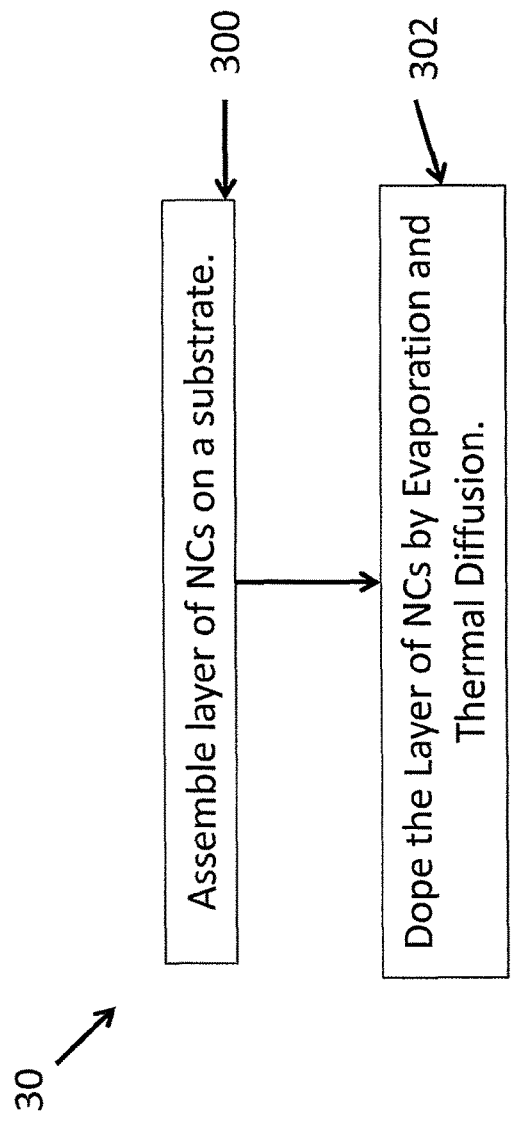
FIG. 3 is a flowchart depicting formation of a nanocrystal-based thin film device in accordance with aspects of the invention.

FIG. 3 is a flowchart 30 of exemplary steps for fabricating a device (e.g., NC thin film electronic, optoelectronic, photonic, and/or other devices) utilizing nanocrystal-based thin films. The NCs may be cadmium based (e.g., CdS, CdSe, CdTe), zinc based (e.g., ZnS, ZnSe, ZnTe), nickel based (e.g., NiFe), gold based, silver based, bismuth based, and/or lead based (e.g., PbS, PbSe, PbTe). Other suitable NC compositions, alloys and core/shells will be understood by one of skill in the art from the description herein.

At block 300, a layer of NCs are assembled on a substrate. The substrate may be flexible (e.g. polyimide) or substantially non-flexible (e.g. glass, silicon, etc.). The layer of NCs may be deposited by drop-casting, spin-coating, dip-coating, liquid interface transfer, or printing.

At block 302, the NC thin film is doped to control carrier type and concentration of the device. The device may be a complete NC thin film electronic, optoelectronic, photonic, and/or other device or an intermediate device in the formation of such devices. In one embodiment, the layer is doped by evaporation and facile thermal diffusion of a metal. The metal may be Tin (Sn), Copper (Cu), Indium (In), Gallium (Ga), Lead (Pb), Selenium (Se), Gold (Au), and/or Silver (Ag). Other suitable metals for evaporation and thermal diffusion of NC thin films will be understood by one of skill in the art. In a particular embodiment, the metal may deposit as a thin blanket layer across the NC thin film. In an alternative embodiment, the metal may be deposited locally on the NC thin film (e.g., as part of electrodes). The thickness of the deposited metal may range from about 0.1 Å to about 1000 Å. In embodiments where the metal is deposited as a blanket layer, the layer may be thinner than embodiments where the metal is deposited locally. Thermal diffusion may occur at about room temperature (approximately between about 18 C and about 30 C) with no additional heat applied, or thermal diffusion may occur upon annealing of the metal after deposition on the thin film. Other suitable thicknesses and diffusion temperatures will be understood by one of skill in the art from the description herein.

Figure 4:
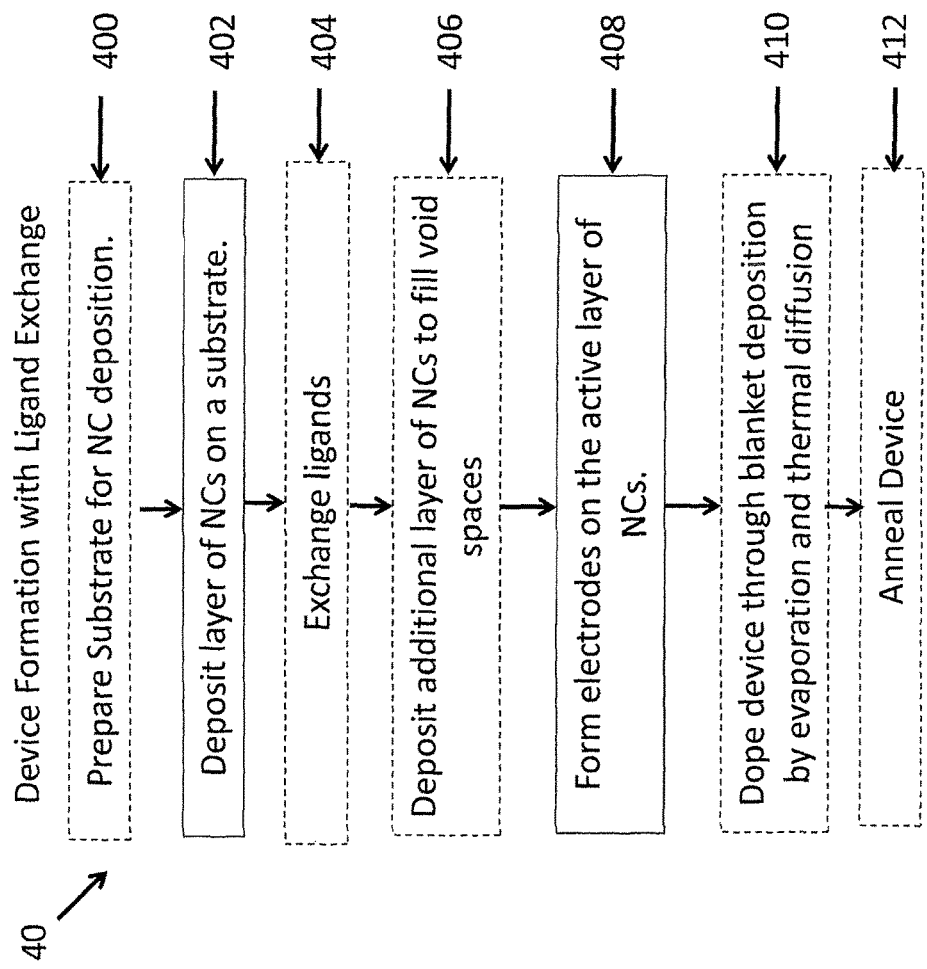
FIG. 4 is a flowchart depicting formation of a device in which nanocrystals undergo ligand exchange according to aspects of the invention.

FIG. 4 is a flowchart 40 of exemplary steps for fabricating a device (e.g., field-effect transistor (FET), photodetector, etc.) utilizing nanocrystal-based thin films and ligand exchange methods as described in flowchart 10 or flowchart 20 along with optional doping by evaporation and thermal diffusion to control carrier type and concentration on the device. The NCs may be cadmium based (e.g., CdS, CdSe, CdTe), zinc based (e.g., ZnS, ZnSe, ZnTe), nickel based (e.g., NiFe), gold based, silver based, bismuth based, lead based (e.g., PbS, PbSe, PbTe). Other suitable NC compositions, alloys and core/shells will be understood by one of skill in the art from the description herein. All steps of flowchart 40 may be performed in a nitrogen atmosphere.

At block 400, a substrate is optionally prepared prior to the deposition of NCs. The substrate may be flexible (e.g., polyimide, parylene, etc.), or substantially non-flexible (e.g., $SiO_2$, Si, and/or $Al_2O_3$). In one embodiment, electrodes are optionally deposited on the substrate prior to deposition of the NCs. The electrodes may be Al, In, Ga, Pb, Se, Au, Ag, etc. Other suitable materials for use as electrodes will be understood by one of skill in the art. In a particular embodiment, a metal is blanket deposited on the substrate. The metal may be In, Ga, Pb, Se, Au, Ag, etc. Other suitable materials for blanket deposition will be understood by one of skill in the art. In an alternative embodiment, the metal may be patterned using shadow masks or photolithography. Lateral electrodes may be patterned on the substrate in embodiments where the device to be fabricated is a photodetector. A gate dielectric layer may be formed on the substrate in embodiments where the device to be fabricated is a FET. In one embodiment, the gate dielectric layer may be formed above electrodes deposited on the substrate.

At block 402, a layer of synthesized NCs is deposited on the substrate. In one embodiment, the NCs have undergone solution ligand exchange according to flowchart 20. In an alternative embodiment, the NCs have not undergone ligand exchange. The layer of NCs, having been either previously exchanged or unexchanged, may be deposited by drop-casting, spin-coating, dip-coating, liquid interface transfer, and/or printing. Other suitable deposition techniques will be understood by one of skill in the art from the description herein. The NCs may be filtered through a PTFE (Teflon) filter prior to deposition on the substrate. In one embodiment, the deposited layer is about as thin as a monolayer. The layer of NCs may be thicker, however, to increase the density of the layer, thereby improving conductivity. In an exemplary embodiment, the thickness of the deposited NC thin films may vary from about 25 nm to about 130 nm. In embodiments where the device is a photovoltaic device, the thickness of the deposited NC thin films may be between about 180 nm and about 250 nm.

At block 404, the substrate with the deposited NCs is then immersed in a bath containing a solution with shorter ligands to facilitate ligand exchange in embodiments where the deposited NCs have not undergone ligand exchange prior to deposition. The ligand exchange may proceed in accordance with the method described in flowchart 10. The bath may contain a chalcogenocyanate-based solution. In a particular embodiment, the bath may be $NH_4SCN$ in acetone or methanol. The concentration of $NH_4SCN$ may be about 1%. In one embodiment, the immersion endures for less than about one minute.

At block 406, at least one additional layer of NCs is optionally deposited on the previously deposited layer of NCs to fill void spaces in the NC layer due to shrinkage resulting from the ligand exchange of block 404. After the additional layer is deposited, the structure may subsequently be immersed in a bath containing a solution with shorter ligands by repeating the step of block 404, ensuring the void spaces of the underlying thin film are substantially filled. In the subsequent bath, the shorter ligands may be chalcogenocyanate-based. In a particular embodiment, the shorter ligands are $NH_4SCN$. In some embodiments, up to three monolayers of the synthesized NCs are successively deposited over the shrunken film. It is contemplated that more monolayers may be deposited to accommodate shrinkage. In alternative embodiments, thicker layers are deposited over the shrunken film to improve the conductivity of the thin film and/or improve light absorption. In further embodiments, a thicker NC layer is desirable where the device fabricated is used as a photodetector or in solar cell applications.

At block 408, electrodes (e.g., source and drain) are deposited on the active nanocrystal layer or channel layer of synthesized NCs. In embodiments where the NC used is semiconductor material, the electrodes are formed on the semiconductor layer. The electrodes may be formed by evaporation through a shadow mask at mild temperatures. The electrodes may be In, Ga, Pb, Se, Au, Ag and/or other conductive material suitable for use as an electrode. In one embodiment, a metal that readily diffuses at fabrication temperature may be built into the electrode such that the built-in metal dopes the NC layer. In alternative embodiments, the electrodes may be a layered combination of conductive metals that readily diffuse and conductive metals that do not readily diffuse at fabrication temperature or upon thermal annealing. In an embodiment, Al may be layered above Se, such that the Se diffuses at fabrication temperature to dope the NC layer and the Al acts as the conductive electrode. In an embodiment, Au may be layered on top of In, such that the In is triggered to diffuse upon thermal annealing to dope the NC layer and the Au acts as the conductive electrode. Other suitable layering patterns of conductive and diffusive metals will be understood by one of skill in the art from the description herein.

At block 410, the substrate with the thin film and electrodes is optionally doped to control carrier type and concentration. In a particular embodiment, the doping occurs by evaporation and thermal diffusion. The metal may be In, Au, Ag, Pb, Ga, Se, and/or other conductive material suitable for use as an electrode. The thin film may be doped by blanket deposition of a metal across the entirety of the thin film followed by diffusion of the metal. In embodiments where blanket deposition occurs with such materials, room temperature provides enough thermal energy for diffusion through thin films. For example, Pb diffused 60-80 nm and Se diffused 50-70 nm. Blanket deposition of a metal and doping by evaporation and thermal diffusion may be used to control the polarity of charge transport of the device. In embodiments where a lead-based (e.g., PbS, PbSe, etc.) thin film device has a blanket deposition of Pb and is doped by evaporation and thermal diffusion, the surface of the device is more n-type. In embodiments where a lead-based (e.g., PbS, PbSe, etc.) thin film device has a blanket deposition of Se and is doped by evaporation and thermal diffusion, the surface of the device is more p-type. Other materials suitable for blanket deposition and doping by evaporation and thermal diffusion will be understood by one of skill in the art from the description herein. Alternatively, a thin film blanket deposited with a dopant metal may be annealed. In a particular embodiment, In may be blanket deposited on a cadmium-based (e.g., CdS, CdSe) thin film. The thin film may also be doped by a metal built into the electrodes as described in block 408.

At block 412, the substrate with the thin film and electrodes (the "device") may be annealed. The device may be annealed for about 10 minutes. The device may be annealed at temperatures ranging from about room temperature to about 300 C. In a particular embodiment, the device is annealed at temperatures ranging from about 200 C to about 250 C. In an exemplary embodiment, the device is annealed at about 250 C. Annealing at elevated temperatures allows for long range diffusion, which is desirable in the design of some devices.

Figure 5:
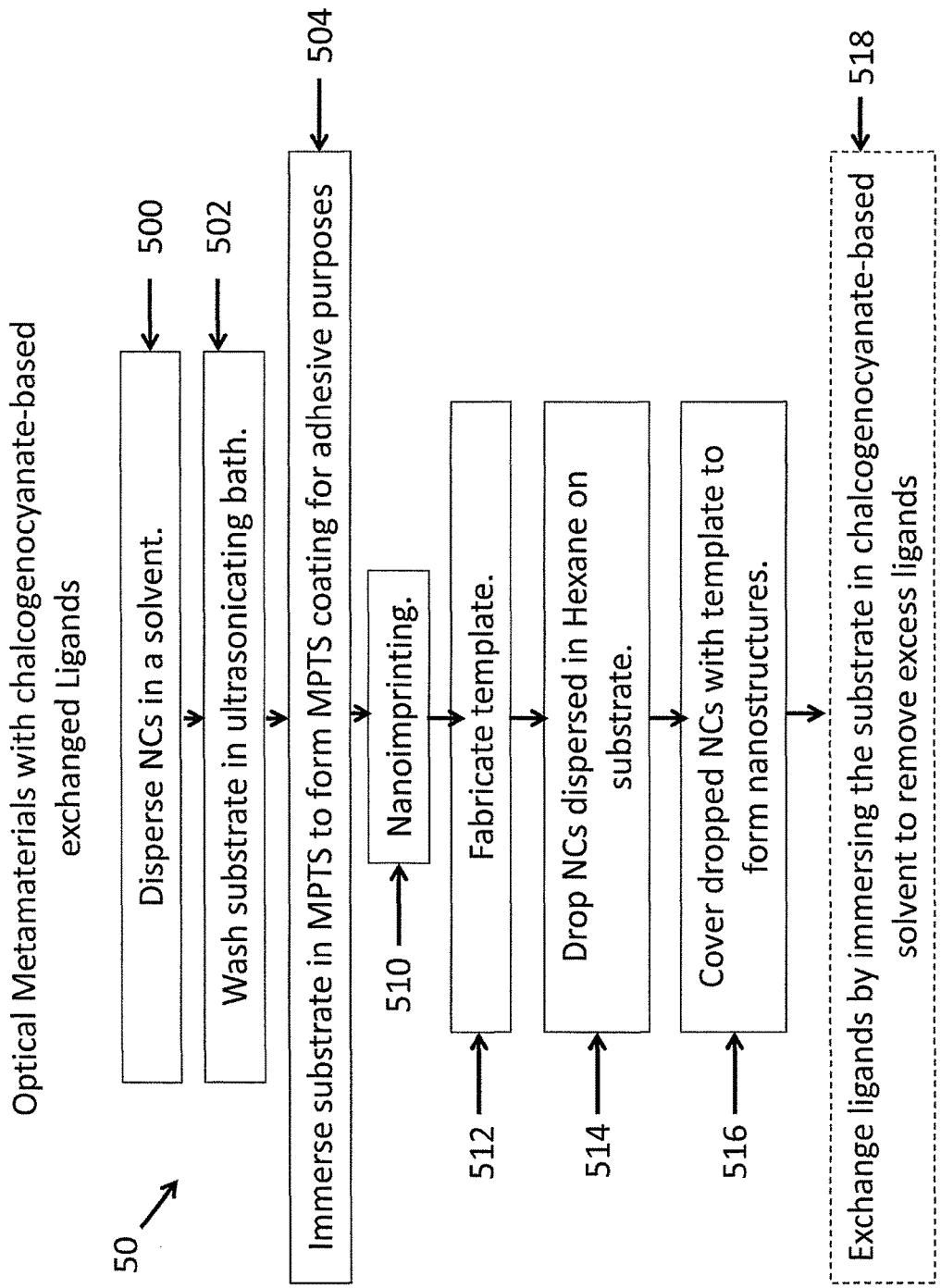
FIG. 5 is a flowchart depicting formation of metamaterial devices with nanocrystals which undergo ligand exchange in accordance to aspects of the invention.

FIG. 5 is a flowchart 50 of exemplary steps for forming optical metamaterials with NCs. The NCs may be cadmium based (e.g., CdS, CdSe, CdTe), zinc based (e.g., ZnS, ZnSe, ZnTe), nickel based (e.g., NiFe), gold based, silver based, bismuth based, and/or lead based (e.g., PbS, PbSe, PbTe). At block 500, NCs are dispersed in a solvent (e.g., hexanes, octanes, etc.). Other suitable NC compositions, alloys, and/ or core/shells will be understood by one of skill in the art.

At block 502, substrates are prepared and washed in an ultrasonicating bath. The substrate may be glass, quartz, polydimethylsiloxane (PDMS), polyethyleneterephthalate (PET), low-density polyethylene (LDPE) or any other substrate operable for use in the invention as will be recognized by one of skill in the art from the description herein. The ultrasonicating bath may consist of solvents, e.g. alkaline detergent, deionized water, hydrochloric acid, ethanol, etc. The bath may also comprise a sequence of different solvents. In an exemplary embodiment, the sequence of solvents is alkaline detergent, deionized water, about 1 M hydrochloric acid, deionized water, and ethanol.

At block 504, the substrate is immersed in a liquid to aid in the adhesion of NCs to the substrate. In an exemplary embodiment, the liquid is about 5% 3-MPTS in toluene, and the substrate is immersed in this liquid overnight. In a particular embodiment, the surface of the substrate may be derivatized with octadecylphophonic acid (ODPA).

At block 512, a nanoimprinting template is prepared from a master template. The template may be a PDMS, h-PDMS, and/or PVA template. In one embodiment, the template is formed by mixing about 10:1 ratio of Sylgard 184 prepolymer and crosslinker, and pouring the mixture on the master template. In this embodiment, the template is then degassed for about 1 hour and cured at about 120 C for about 30 minutes. The template is then released from the master template. The PDMS template may have various arrays for different diameters and pitches of nanopillars, e.g. about 120 nm/700 nm, about 200 nm/500 nm, about 270 nm/700 nm, about 300 nm/850 nm, etc. The template may be formed with arrays to construct nanolines, nanopillars and/or nanoholes. Other suitable nanostructures will be understood by one of skill in the art.

At block 514, a dispersion of NCs in a solvent (e.g., hexanes, octanes, etc.) is dropped onto the substrate. The amount of dispersion dropped onto the substrate may be about 100 uL, or any other amount in accordance with the size of the substrate. In one embodiment, the NCs have undergone solution ligand exchange according to flowchart 20. In an alternative embodiment, the NCs have not undergone ligand exchange.

At block 516, the substrate with the dropped dispersion of NCs is covered and pressed with the patterned template. The covering and pressing may be done at about room temperature and at about 100 psi. The solvent deposited on the substrate to aid in the adhesion of the NCs may then be evaporated. After evaporation, the template is detached from the substrate.

At block 518, a ligand exchange is conducted in embodiments where the NCs have not undergone a ligand exchange prior to deposition on the substrate. The ligand exchange may be conducted according to the solid exchange method of flowchart 10. The substrate may be immersed in a solution containing shorter ligands.

In one embodiment, the solution is a chalcogenocyanate-based solution. The chalcogenocyanate-based solution may contain KSCN, NH4SCN, or any other chalcogenocyanate-based solution suitable for ligand exchange as will be recognized by those of skill in the art from the description herein. In one embodiment, the chalcogenocyanate-based solution is about 1% NH4SCN in acetone or methanol, and the substrate was immersed in the solution for about two minutes. The substrate is then removed from the chalcogenocyanate-based solution. The substrate may be immersed in at least one subsequent bath comprising a solvent. The bath may be pure acetone or methanol and the substrate may be immersed in the pure acetone or methanol for about one minute. The substrate may be immersed in successive baths to ensure the ligands are exchanged properly. With the exception of the formation of the template at block 512, all steps may be performed at about room temperature.

Figure 6:
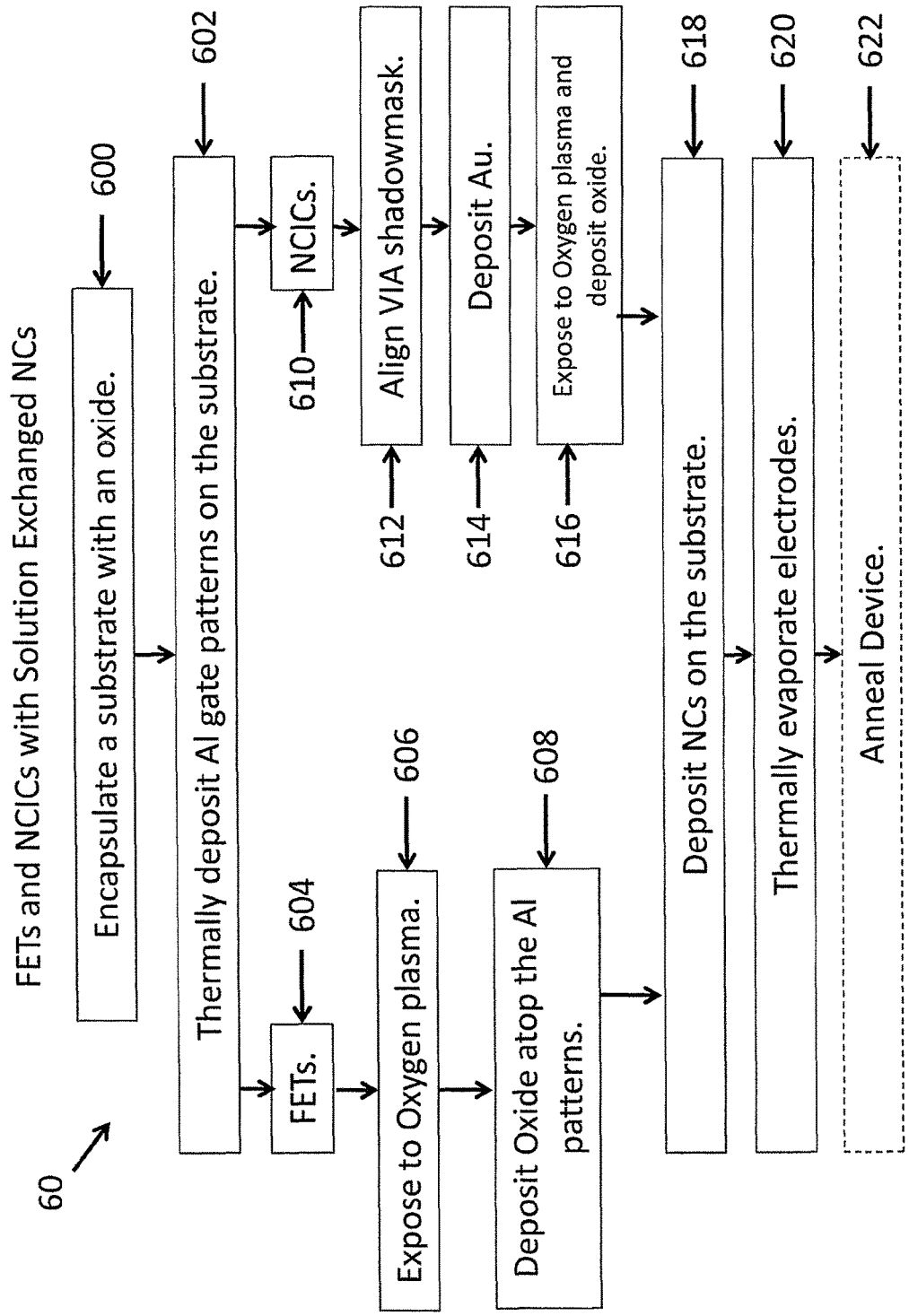
FIG. 6 is a flowchart depicting formation of field-effect transistors (FETs) and Nanocrystal Integrated Circuits (NCICs) in which the NCs undergo ligand exchange in accordance with aspects of the invention.

FIG. 6 is a flowchart 60 of exemplary steps of forming Field-Effect Transistors (FETs) and Nanocrystal Integrated Circuits (NCICs) with NC thin films and doping by evaporation and thermal diffusion. The NCs may be cadmium based (e.g., CdS, CdSe, CdTe), zinc based (e.g., ZnS, ZnSe, ZnTe), nickel based (e.g., NiFe), gold based, silver based, bismuth based, lead based (e.g., PbS, PbSe, PbTe). Other suitable NC compositions, alloys and core/shells will be understood by one of skill in the art from the description herein. In a particular embodiment, semiconductor NCs are used. All steps in flowchart 60 may be performed in a nitrogen atmosphere. In an alternative embodiment, all steps in flowchart 60 may be performed using a substantially non-flexible substrate. At block 600, a flexible substrate is encapsulated with an oxide. The flexible substrate may be a polyimide substrate. The thickness of the substrate may be about 25 um, about 50 um, or other thicknesses operable to carry out the invention. The flexible substrate may be covered with an atomic layer deposited (ALD) layer to preshrink the flexible layer for the prevention of delamination and cracking of subsequently deposited layers. The ALD layer may be an oxide. In one embodiment, the ALD layer is Al2O3. In an embodiment where the flexible substrate has a thickness of about 25 um or about 50 um, the ALD layer is about 30 nm thick. The ALD layer may be deposited at a temperature of about 250 C. In one embodiment, where the NC thin film will undergo a solid ligand exchange according to flowchart 10, the surface of the deposited Al2O3 may be derivatized with octadecylphosphonic acid (ODPA) to further reduce hysteresis and complete the dielectric stack.

At block 602, a back gate is deposited on the ALD layer. The back gate may be about 20 nm thick. In one embodiment, the back gate is Al. The back gate may be deposited by thermal evaporation through a shadow mask, by photolithography, or other suitable deposition methods.

Blocks 604, 606, and 608 depict steps for forming FETs. At block 606, the structure is exposed to an oxygen plasma in embodiments where the ALD layer is Al2O3 and the back gate is Al to increase the thickness of the native Al2O3 on the Al back gate. The oxygen plasma may be about 100 W. The exposure may have a duration of about 10 minutes.

At block 608, a gate dielectric layer is formed on the structure. The gate dielectric layer may be about 30 nm thick, or any other thickness as necessary to render the device operable based on the thickness chosen for other layers. In one embodiment, the gate dielectric layer is Al2O3.

Blocks 610, 612, 614, and 616 depict steps followed in embodiments where the FETs produced according to blocks 604-608 are used to form NCICs. At block 612, a vertical interconnect access (VIA) shadow mask is microscopically aligned to the Al gate lines atop the ALD layer.

At block 614, material is deposited to pattern the VIA and integrate device layers. In one embodiment, the material deposited is about 60 nm of Au. The Au may be deposited by evaporation. Other suitable materials and deposition techniques will be understood by one of skill in the art from the description herein.

At block 616, the back gate and the VIA is exposed to an oxygen plasma in embodiments where the ALD layer is Al2O3 and the back gate is Al to increase the thickness of the native Al2O3 on the Al back gate, and an oxide is subsequently deposited on the Al. The oxygen plasma may be about 100 W. The exposure may have a duration of about 10 minutes. A gate dielectric layer is subsequently formed on the Al back gate, leaving the Au exposed. In one embodiment, the gate dielectric layer may be about 30 nm thick. The thickness is selected as necessary to render the device operable based on the thickness chosen for other layers as will be recognized by those of skill in the art from the description herein. In one embodiment, the gate dielectric layer is Al2O3. In a particular embodiment where the gate dielectric layer is Al2O3 and the NCs to be deposited have not undergone a solution ligand exchange, the surface of the Al2O3 layer may be derivatized with octadecylphosphonic acid (ODPA) to further reduce hysteresis and complete the dielectric stack.

At block 618, for either devices constructed for use as an FET or use in an NCIC, a layer of synthesized NCs is deposited on the gate dielectric layer. The NCs may have undergone solution ligand exchange according to flowchart 20. In an embodiment where the NCs have undergone solution ligand exchange, the NCs may have been exchanged with chalcogenocyanate-based ligands. In a particular embodiment, the NCs have undergone a solution ligand exchange with NH4SCN ligands. In an alternative embodiment, the deposited NCs have not undergone a ligand exchange, and following the deposition of the NC as a thin film, the ligands may be exchanged according to flowchart 10. In one embodiment, the NCs are substantially monodisperse. The NCs may be deposited on the gate dielectric layer by spin-casting, dip-coating, or by any other suitable deposition method understood by those of skill in the art.

At block 620, source and drain electrodes are formed on the NC layer and the device is optionally doped. The formation of the electrodes may occur in a nitrogen glovebox. In one embodiment, the nitrogen glovebox contains an integrated evaporator. The electrodes may be deposited by evaporation through a shadow mask on the NC layer. The electrodes may be In, Au, Ag, or any other material suitable to render the device operable. In one embodiment, the electrodes may be metal NCs and the NCs may have xCN-based ligands. The electrodes may contain a metal doping layer as described in block 408 and the NC layer may be doped by evaporation and thermal diffusion of the metal doping layer. In a particular embodiment, In, Pb, and/or Se may comprise the metal doping layer in the electrodes. In an exemplary embodiment, the electrodes are Au formed on top of In. In embodiments where the electrodes are In, the thickness of the electrodes may be about 50 nm. In embodiments where the electrodes are Au formed on top of In, the thickness of the Au electrodes may be about 40 nm and the thickness of the In electrodes may be about 10 nm to about 50 nm. In some embodiments, a metal may be blanket deposited over the NC thin film and used to dope the NC thin film by evaporation and thermal diffusion, as described at block 302. In particular embodiments, the blanket deposited metal may be In, Pb, and/or Se. In an exemplary embodiment, the thickness of the blanket deposited layer may be between about 0.1 Å and about 30 Å. Other suitable materials will be understood by one of skill in the art from the description herein. The formation of electrodes may complete a back-gate/top-contact FET. In one embodiment, the formation of electrodes completes a back-gate/bottom-contact FET. The electrodes may be fabricated to different topologies or configurations used to form different integrated circuits. In one embodiment, the electrodes may comprise metal NCs and the NCs may have xCN-based ligands. Metal NC electrodes may be used to form a bottom contact device or a top contact device. In a particular embodiment, the source and drain electrodes were deposited in a back-gate/bottom-contact FET by spincoating silver NCs atop a resist patterned by imprint lithography, with subsequent xCN-based ligand treatment. In an alternative embodiment, the silver NCs to be used as source and drain electrodes may have undergone xCN-based ligand treatment according to the solution exchange method of flowchart 20.

At block 622, after the deposition of electrodes, the structure may be annealed. The structure may be annealed in a nitrogen atmosphere. In one embodiment, the structure is annealed at about 250 C for about 10 minutes.

Figure 7B:
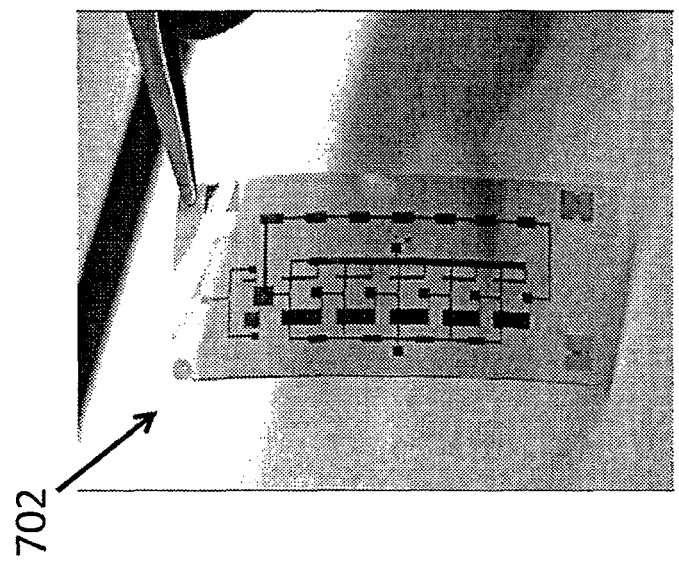
FIGS. 7A and 7B are illustrations of flexible NCICs fabricated in accordance with aspects of the invention.
Figure 7A:
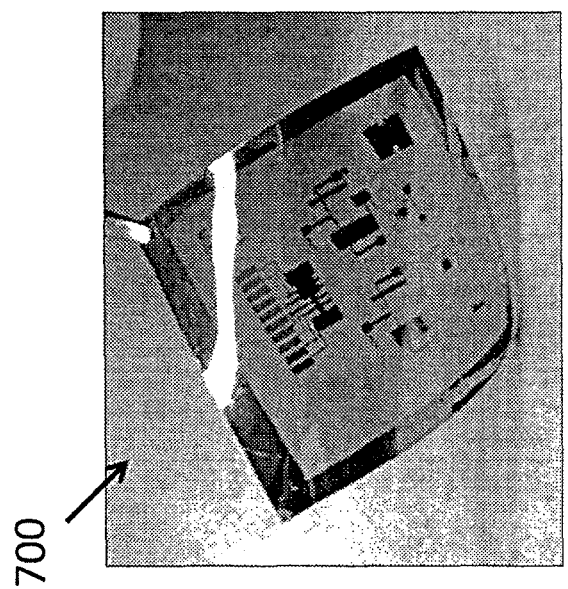

FIGS. 7A and 7B depict NCICs formed in accordance with one embodiment of the invention. The NCICs are fabricated by matching the topology patterns of the formed FETs with VIA masks. The NCIC may be an inverter 700

(FIG. 7A), an inverter operating as a common source with active load voltage amplifier, or a ring oscillator 702 (FIG. 7B).

Figure 8:
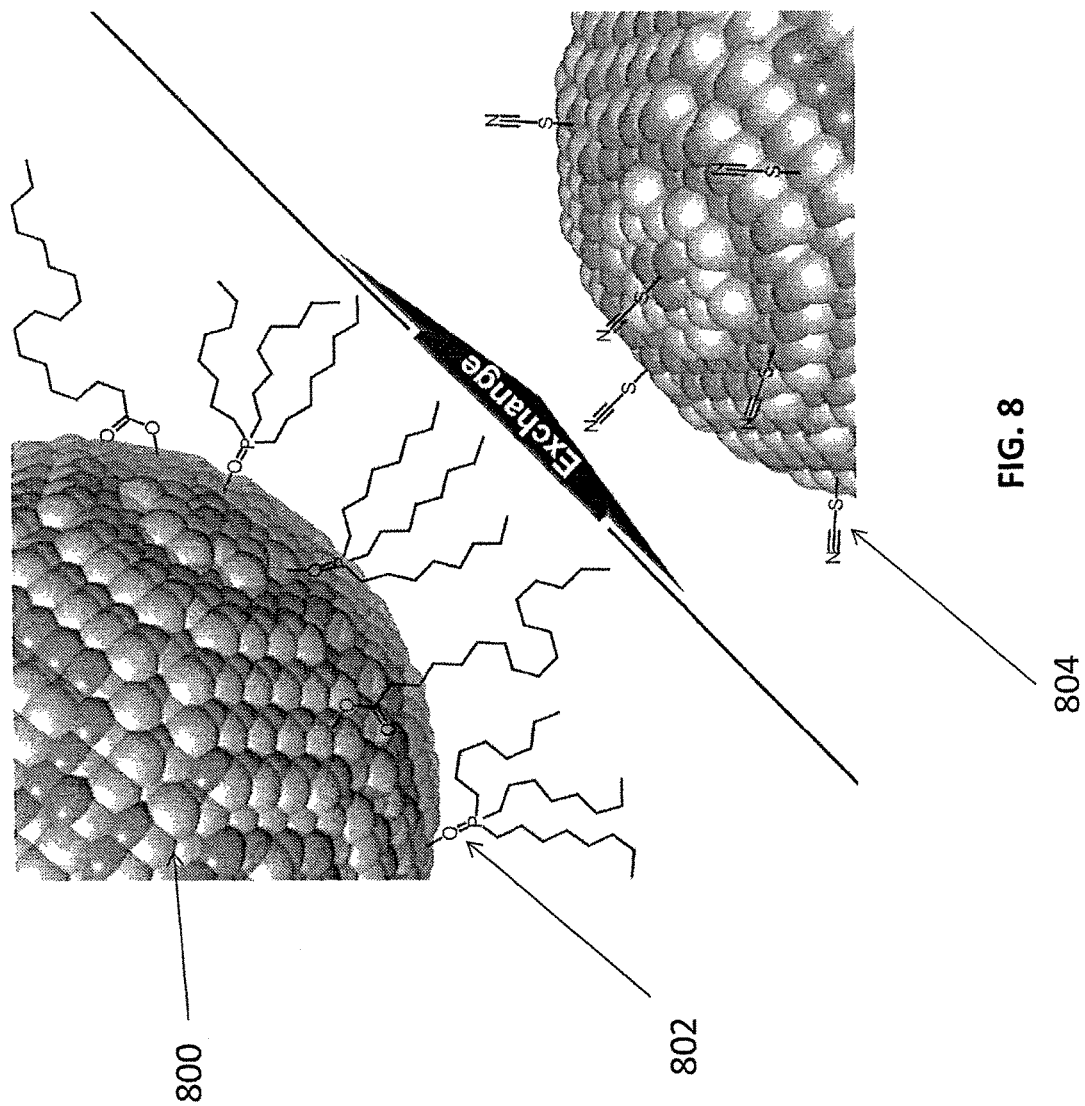
FIG. 8 is an illustration of an NC with relatively long bulky ligands and short xCN-based ligands after exchange in accordance with aspects of the invention.

FIG. 8 is a depiction illustrating an NC 800 capped with relatively long bulky ligands 802. Following exchange, the NC 800 is capped with shorter, xCN-based ligands to allow for closer interparticle spacing when forming devices.

Figure 9:
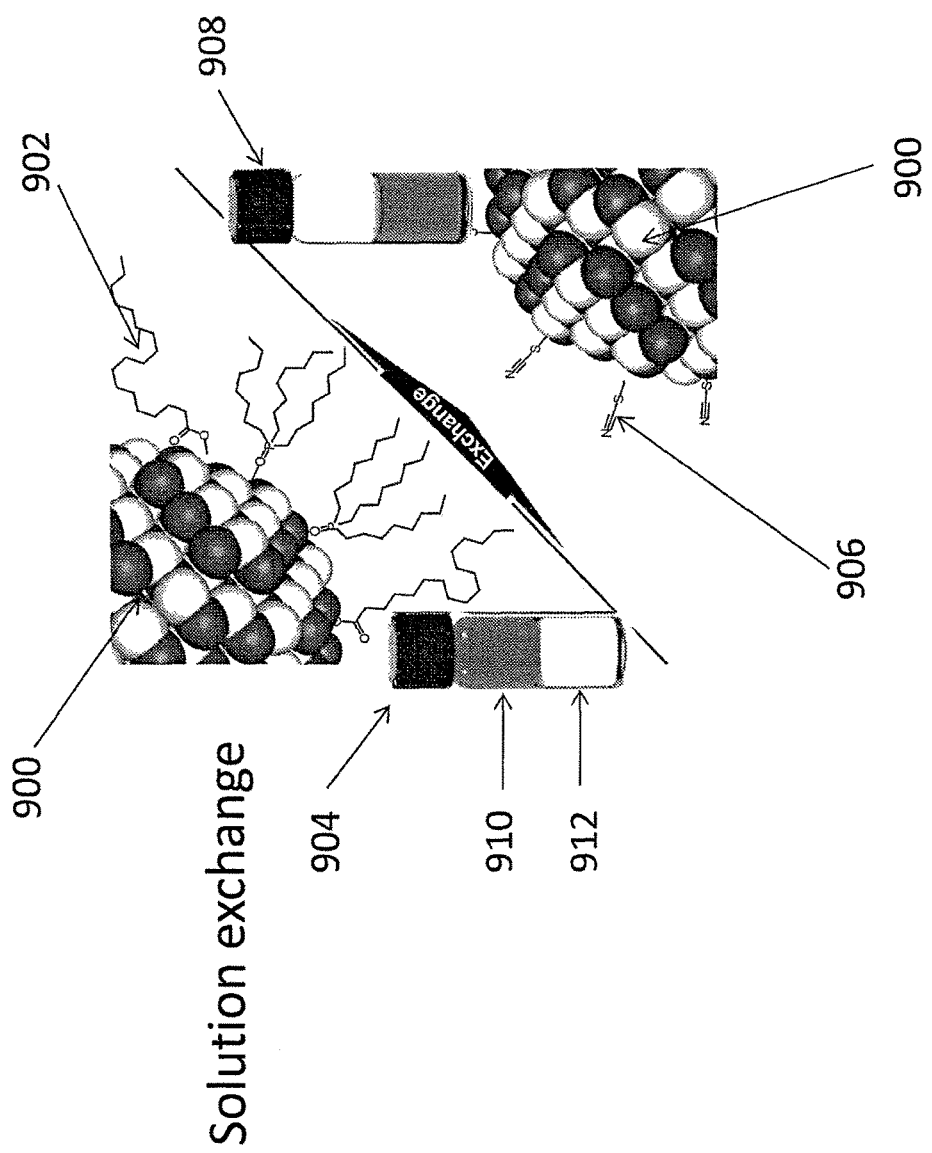
FIG. 9 is an illustration of solution ligand exchange in accordance with aspects of the invention.

FIG. 9 is a depiction illustrating solution exchange in accordance with one embodiment of the invention. Cadmium and selenium atoms are formed into an NC 900. Various bulky ligands 902 are shown in stick representation on the surface of NC 900. The inset 904 shows a biphasic mixture of hexane 910 and DMSO 912. The CdSe NCs 900 are dispersed in the non-polar (hexane) phase. Following solution ligand exchange, the bulky ligands 902 on NC 900 are exchanged with SCN-based ligands 906. Inset 908 shows the CdSe NCs 900 dispersed in the polar phase after ligand exchange. Other suitable materials, solvents, and ligands to conduct solution exchange will be understood by one of skill in the art from the description herein.

Figure 10B:
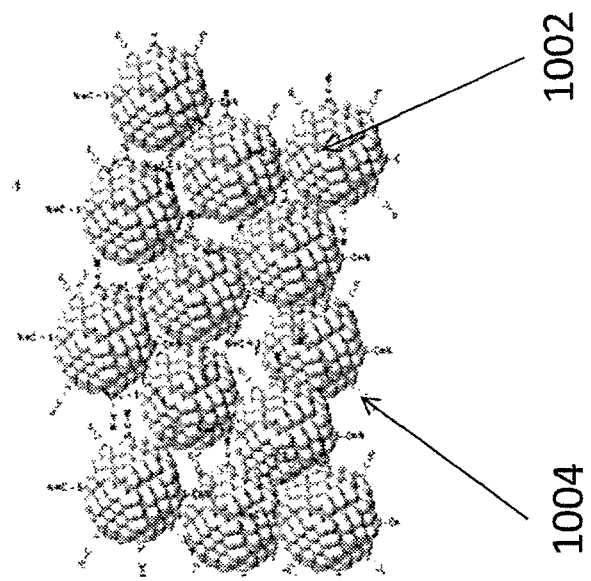
FIG. 10B is an illustration of multiple NCs after xCN-based ligand exchange in accordance with aspects of the invention.
Figure 10A:
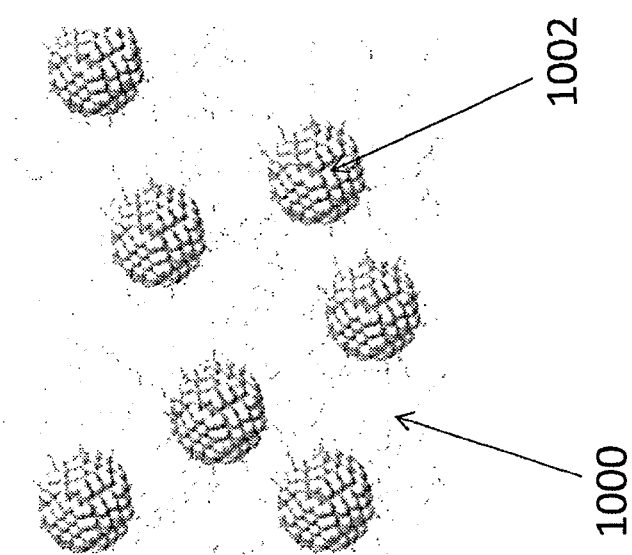
FIG. 10A is an illustration of multiple NCs before ligand exchange according to the prior art.

FIG. 10A illustrates a plurality of NCs 1002 with a plurality of relatively bulky ligands 1000 in accordance with the prior art preventing close interparticle spacing necessary to construct electronic, optoelectronic, and photonic devices. FIG. 10B illustrates a plurality of NCs 1002 and a plurality of shorter, xCN-based ligands 1004 spaced between the plurality of NCs 1002 in accordance with aspects of the invention. The shorter interparticle spacing provided by xCN-based ligands provide for NC-based thin film electronics, optoelectronics, and photonics, for example. Other thin film structures and exchanges using other ligands will be understood by one of skill in the art from the description herein.

EXAMPLES

Solid Exchange: In one embodiment, ligands are exchanged after the formation of synthesized NCs into a thin film. The NCs may be cadmium based (e.g., CdS, CdSe, CdTe), zinc based (e.g., ZnS, ZnSe, ZnTe), nickel based (e.g., NiFe), gold based, silver based, bismuth based, and/or lead based (e.g., PbS, PbSe, PbTe). Synthesized NCs were dispersed in hexanes and assembled into thin films by drop-casting the NCs on sapphire, glass, or polished substrates. Self-assembled monolayers of MPTS were necessary on the glass and silicon substrates to prevent the delamination of the NC films after the ligand exchange. The native oxide on the glass and silicon substrate was not stripped in order to effectuate the silane chemistry. The films were immersed in 2-propanol solution for 10 minutes to remove any nonspecifically bound ligands. Ligand exchange was performed by immersing the films in 130 mM (1%, w/v) NH4SCN in acetone for 1 minute, followed by immersion in two successive baths of pure acetone for 1 minute each.

General NC solution exchange: In one embodiment, the ligand exchange in an NC solution was conducted in accordance with the following method. 0.5 mL of 130 mM NH4SCN in acetone was added to 1 mL of a dispersion of synthesized NCs in hexanes and the resulting solution was agitated for 1 minute. Complete flocculation was observed within seconds. The slurry was centrifuged at 2000×g for 1 minute and the supernatant discarded. A 1 mL volume of acetone was added, the slurry agitated for 1 minute and centrifuged at 2000×g for 1 minute. The supernatant was discarded. A 1 mL volume of DMSO was added to the pellet, and the mixture was gently agitated until the NCs were fully dispersed. The resultant dispersion was centrifuged at 3000×g for 4 minutes and no solid was observed for the solution-dispersible materials reported.

CdSe NC solution exchange: In one embodiment, the ligand exchange in a CdSe NC solution was conducted in accordance with the following method. Each of the steps were performed in a nitrogen atmosphere with anhydrous solvents. A 0.5 mL volume of 130 mM NH4SCN in acetone was added to 1 mL of a dispersion of CdSe NCs in hexanes. The above mentioned concentration was controlled by adjusting the optical density of the dispersion at the peak of the lowest energy excitonic absorption feature. (For example, 583 nm for 3.9 nm diameter NCs, to a value of 10-20 per centimeter). The resulting solution was then stirred with a vortexing mixture at 3000 rpm for two minutes. The slurry was centrifuged at 2000×g for 1 min and the supernatant discarded. A 1 mL volume of tetrahydrofuran was added, the slurry stirred at 3000 rpm for two minutes and centrifuged at 2000×g for one minute, and the supernatant discarded. A 1 mL volume of toluene was then added, the slurry stirred at 3000 rpm for one minute and centrifuged at 2000×g for 1 minute, and the supernatant discarded. A 0.2 mL volume of dimethylformamide (DMF) was added to the pellet, and the mixture was gently agitated until the NCs were fully dispersed.

CdSe NC FET fabrication: In one embodiment, a CdSe NC FET was fabricated in accordance with the following method. A solution SCN ligand exchange was performed in accordance with the previously described method in the example above, and the NCs used were CdSe NCs dispersed in DMF. FETs were fabricated on n+ doped Si wafers with 250 nm thermally grown SiO2, and atomic-layer deposited 20 nm thick Al2O3 on the thermally grown SiO2. The Si and the oxide layers served as the gate and gate dielectric layers of the FETs, respectively. The CdSe thin films were deposited by spin-casting. The thickness of the films was controlled by varying the optical density at the peak of the lowest energy excitonic absorption. The dispersion was filtered through a 0.2 um PTFE filter. The spin-casting deposition was performed by spin-casting at 500 rpm for 30 seconds, followed by 800 rpms for 30 seconds. Source and drain electrodes were deposited in an evaporator integrated in a nitrogen glovebox. 20 nm thick In/30 nm thick Au source and drain electrodes were deposited by evaporation through a shadow mask to form top contact, bottom gate FETs. Channel lengths and widths ranged with a constant W/L of 10 (a W/L of 15 has been used). The evaporation rate of the electrodes was kept constant at 0.3 Å/s monitored by a quartz crystal microbalance. Deposition was carried out at a substrate constant temperature of 28 to 30 C. The device was annealed at 250 C for 10 minutes to allow for thermal diffusion of In from the electrodes into the NC thin film.

Figure 11B:
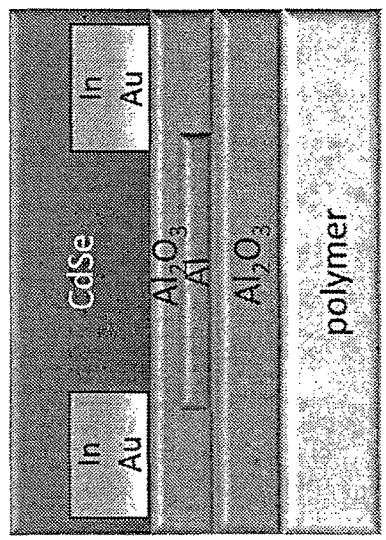
FIGS. 11A, 11B, and 11C are illustrations of flexible CdSe thin-film FETs fabricated in accordance with an aspect of the invention.
Figure 11C:
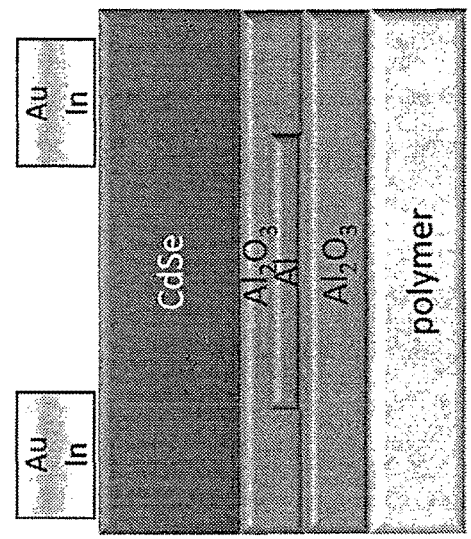
Figure 11A:
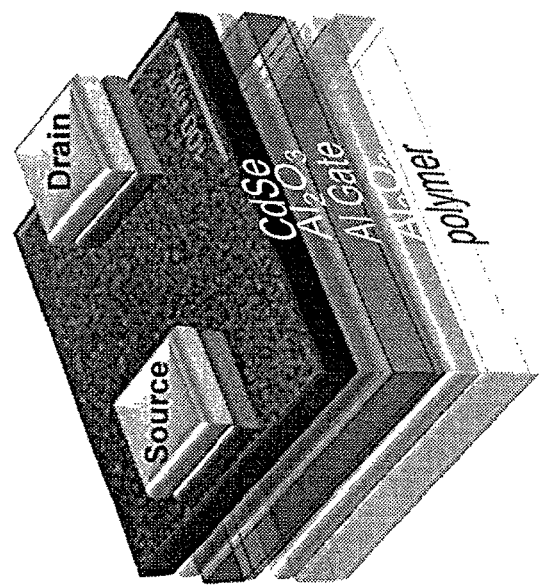

FIG. 11A is a depiction illustrating a CdSe flexible thin-film FET fabricated in accordance with this embodiment of the invention. FIG. 11B is a depiction illustrating an alternative embodiment of a CdSe flexible thin-film FET in a bottom-contact bottom-gate configuration. FIG. 11C is a depiction illustrating another alternative embodiment of a CdSe flexible thin-film FET in top-contact bottom-gate configuration. Although CdSe flexible thin-film FETs are depicted in FIGS. 11A-11C, one of skill in the art will recognize how to make non-flexible FETs as well as other devices and will understand the materials that may be used to make other flexible and non-flexible structures utilizing the invention from the description herein.

Photodetector Fabrication: In one embodiment, photodetector devices were fabricated in accordance with the following method. Precleaned quartz was used as a substrate onto which 20 nm thick Au electrodes (10 um channel length, 150 um channel width) were photolithographically defined. CdSe NCs that underwent the solution ligand exchange method above were used. Thin films of CdSe NCs were drop-cast from DMF onto the substrate held at 50 C. The active area was sealed using epoxy (5 minutes, ITW Devcon) under a glass overslip in a nitrogen atmosphere.

PbS NC flexible electronic device: In one embodiment, a flexible PbS NC electronic device was fabricated in accordance with the following steps. 20 nm thick Au gate electrodes were deposited on a Kapton substrate by evaporation, followed by coating with a 500 nm thick parylene gate dielectric. A monolayer of NCs was formed by dropping a solution of NCs in hexane on an aliquot of acetonitrile. The monolayer is then transferred on to the substrate. The substrate was then immersed in 130 mM (1% w/v) NH4SCN in acetone for less than one minute and washed in acetone in order to perform a solid exchange of ligands as described above. This exchange caused shrinkage of the film, creating void spaces. To overcome the void spaces, three successive layers of NCs were deposited and immersed in SCN. 20 nm thick Au source and drain electrodes were vacuum evaporated on the active layer through a shadow mask. The device may be annealed at 120 C-150 C for about 30 minutes to get better transport. This device exhibited ambipolar behavior as it was not doped by evaporation and thermal diffusion of a dopant metal. All steps were performed under nitrogen atmosphere.

PbSe NC FET Fabrication: In one embodiment, a PbSe NC FET was fabricated in accordance with the following steps. All steps were conducted under a nitrogen atmosphere after substrate cleaning and treatment with a self-assembled monolayer, unless specified. A PbSe NC FET was fabricated on heavily n-doped silicon wafers with 250 nm of thermally grown SiO2, which serve as the back gate and part of the gate dielectric stack, respectively. The substrate was washed with DI water, acetone, and IPA and cleaned with UV-ozone for 30 min. A 20 nm layer of Al2O3 was deposited by atomic layer deposition on top of the SiO2, after which the substrate was cleaned with chloroform and acetone before being subjected to 30 more minutes of UV-ozone to ensure that there was no buildup of unwanted organics. The substrate was then immersed in octadecylphosphonic acid (ODPA) in IPA for 16 h to create an organic monolayer of ODPA. When the substrate was removed from the solution, it was rinsed with clean IPA and heated to 70_C for 10 min. To make the device, the substrate was first cleaned again with chloroform and acetone and then transferred to a nitrogen glovebox. A solution of 10 mg/mL PbSe NCs in octane was spin-coated at 800-1200 rpm to deposit a uniform nanocrystal thin film solid, and the original oleic acid ligands were replaced with various shorter ligands, using the ligand exchange processes described above. 40 nm Au source and drain top contacts separated by 50-150 μm were defined by evaporation through a shadow mask. Channel lengths (L) and widths (W) were a constant W/L of 15 for the device. To this point, the PbSe FET is still an ambipolar device. After the PbSe was fabricated, the device was doped to switch the polarity of charge transport according to the following steps. Using an evaporator integrated into a nitrogen glovebox, Pb and Se were deposited onto the NC thin film samples on the PbSe FETs, with a source-to-sample distance of 30 cm, by evaporation and thermal diffusion at a base pressure of $8 \times 10^{-7}$ Torr at an evaporation rate between 0.01 and 0.03 Å/s. Doping by thermally evaporating Se made the surface more p-type while doping by thermally evaporating Pb made the surface more n-type.

PbSe NC Schottky Solar Cell Fabrication: A PbSe NC Schottky solar cell was fabricated according to the following steps. All steps were conducted under a nitrogen atmosphere after substrate cleaning and treatment with a self-assembled monolayer. Photovoltaic cells were fabricated on patterned ITO on glass substrates. PEDOT:PSS was spin-coated onto patterned ITO substrates and the device was annealed at 150 C. 2-3 nm diameter PbSe NCs with first excitonic absorption at 800-900 nm were used. Multiple layers of PbSe NCs were spin-coated and soaked in BDT in acetonitrile until a thickness of about 180 to about 250 nm was achieved. After PbSe NC Schottky Solar Cell was fabricated, the device was doped to either n-dope or p-dope the device according to the following steps. Using an evaporator integrated into a nitrogen glovebox, Pb and Se were deposited onto the NC thin film samples on the PbSe NC Schottky Solar Cells, with a source-to-sample distance of 30 cm, by evaporation and thermal diffusion at a base pressure of $8 \times 10^{-7}$ Torr at an evaporation rate between 0.01 and 0.03 Å/s. Doping by thermally evaporating Se made the surface more p-type while doping by thermally evaporating Pb made the surface more n-type. In an embodiment, a Schottky Solar Cell is p-doped with Se to increase the Schottky barrier. An Al top contact was formed to complete the device.

Flexible CdSe FET/NCIC fabrication: In one embodiment, flexible CdSe FETs and NCICs were fabricated in accordance with the following method. A 25 um or 50 um thick polyimide substrate was covered with 30 nm of atomic layer deposited (ALD) Al2O3 at 250 C. A 20 nm thick Al back gate was deposited by evaporation through a shadow mask. For NCIC fabrication, a vertical interconnect access (VIA) shadow mask is microscopically aligned and 60 nm of Au was deposited by evaporation to pattern the VIAs and integrate device layers. The substrate was exposed to an oxygen plasma (100 W, 10 Minutes) to selectively increase the thickness of the native Al2O3 atop the Al lines. Atomic layer deposited Al2O3 then selectively deposits a high quality oxide atop the Al that is 30 nm thick. Solution SCN exchanged CdSe NCs dispersed in DMF were spin-cast uniformly atop the flexible substrates. A dispersion of CdSe NCs with an optical density of 40 was filtered through a 0.2 um PTFE filter and spin-cast at 500 rpm for 30 seconds, followed by 800 rpm for 30 seconds. In (50 nm thick)/Au (40 nm thick) electrodes were deposited by evaporation through a shadow mask. The device was then annealed in a nitrogen atmosphere for 10 minutes at 250 C to dope the NC thin film by evaporation and thermal diffusion of the In.

Au NC Examples and Results

Deposition of Au NCs: In one embodiment, Au NCs were deposited on a substrate according to the following steps. 10 nm oleylamine capped Au NCs were dispersed in hexane, flocculated by adding isopropyl alcohol, and isolated by centrifugation. The process may be repeated up to three times to ensure the complete removal of excess oleylamine. The NCs were dispersed in octane for spincasting. Glass and quartz substrates were washed in an ultrasonicating bath, with a sequence of solvents as follows: alkaline detergent, deionized water, 1 M hydrochloric acid, deionized water, and ethanol. To aid in the adhesion of NCs to the substrate after ligand exchange, substrates may be immersed in about 5% MPTS in toluene overnight. Uniform, unpatterned NC thin films were prepared by spincasting. A dispersion of about 75 mg/ml of NCs in octane was filtered though an about 0.2 um polytetrafluoroethylene filter and spincast on to MPTS coated quartz rounds or single-side polished silicon wafers at about 1000 RPM for about 30 seconds.

Nanoimprinting of Au NCs: In one embodiment, Au NC-based plasmonic nanostructures were fabricated according to the following method. A PDMS template was fabricated from a silicon master template. A 10:1 ratio Sylgard 184 prepolymer and crosslinker were mixed and poured on the master template. The master template was then degassed for 1 hour and cured at 120 C for 30 minutes. The PDMS template was then released from the master template. Glass and quartz substrates were washed in an ultrasonicating bath. The sequence of solvents used in the bath was alkaline detergent, deionized water, 1 M hydrochloric acid, deionized water, and ethanol. The substrates were then immersed in 5% 3-mercaptopropyltrimethoxysilane (MPTS) in toluene overnight to assist in the adhesion of NCs to the substrate after ligand exchange. 100 uL of a dispersion of Au NCs in hexane (18 mg/ml) was dropped on to an MPTS coated glass substrate. The substrate was quickly covered and pressed with the PDMS template at room temperature and 100 psi. The cavity between the PDMS template and substrate was filled and excess NC dispersion was expelled. After evaporation of the solvent, the PDMS template was detached from the substrate. The pillar height was 40 nm. Alternatively, the imprinting procedure in the previous embodiment may be used to imprint Au NCs electrodes on a thermally oxidized Si substrate. In a particular embodiment, PbSe NCs may be deposited on a substrate with imprinted electrodes and then undergo ligand exchange according to the solid ligand exchange method of flowchart 10.

Au NC ligand exchange: In one embodiment, the Au NCs may undergo ligand exchange after spincasting or nanoimprinting according to the following steps: The ligands may be exchanged by immersing the substrate in 1% NH4SCN in acetone for 2 minutes, followed by immersion in two subsequent baths of pure acetone for 1 minute each.

Resistivity of Au NC thin films: To determine and compare the conductivity/resistivity of Au NC thin films, Au thin films were formed and measured. Multiple Au NC thin films were formed: one Au NC thin film capped with oleic acid (OLA) ligands, one Au NC thin film capped with ethanedithiol (EDT) ligands, and one capped with thiocyanate (SCN) ligands. In addition, a thermally evaporated Au thin film was formed and measured. The resistivity [$\Omega \cdot cm$] was measured as follows: ~$10^6$ for the OLA capped Au NC thin films, $0.3[\pm 0.2]$ for the EDT capped Au NC thin films, $5.1[\pm 0.8] \cdot 10^{-5}$ for the SCN capped Au NC thin films, and $4.8[\pm 0.4] \cdot 10^{-6}$ for the thermally evaporated Au thin film. The results demonstrate that the SCN capped Au NC thin films produced in an entirely room temperature, solution based process have a resistivity close to that found in thermally evaporated Au thin films.

Ag NC Examples and Results

Deposition of Ag NCs: In one embodiment, Ag NCs capped with tetradecylphosphonic acid were dispersed in hexane, flocculated by adding isopropyl alcohol, and isolated by centrifugation. This process was repeated two times to ensure the complete removal of excess tetradecylphosphonic acid, and the NCs were dispersed in octane for spincasting. Glass and silicon substrates were cleaned and coated with a self-assembled monolayer of 3-mercaptopropyl-trimethoxysilane (MPTS) to aid the adhesion of the NCs after exchange. Uniform, unpatterned NC thin films for Fr-IR and variable angle ellipsometric spectroscopies, AFM, and DC conductivity measurements were prepared by spincasting. A 100 mg/mL dispersion of NCs in octane was filtered through a 0.2 μm polytetrafluoroethylene filter and spincast at 500 rpm for 60 sec. on to MPTS-coated substrates.

Imprint lithography of Ag NCs: In one embodiment, a plasmonic nanostructure with Ag NCs was fabricated according to the following steps: First, commercial glass (Delta-technology) was purchased, and cleaned with acetone, IPA, DI water solution for 10 min, in order, respectively. Then, thermal imprint resist (NXR-1000) was spin-coated at 3000 rpm for 1 min on the glass substrate, and pre-baked at 150° C. for 5 min. It was covered by a master template which has nano-pillar array nanostructures. Then, the stack of master template and substrate was heated up to 130° C. and subsequently pressed into the substrate at 300 psi for 5 min, finally cooled to room temperature and de-molded in a Nanonex NX-2600 nanoimprint tool. Oxygen descum process was performed to the substrate for removing any residual layer. Ag nanocrystal dispersion was spincoated on the imprinted pattern on the glass substrate, for fabricating silver plasmonic nanostructure. The substrate was dipped to the 1% ammonium thiocyanate in methanol, and cleaned with IPA solvent for ligand exchange. Finally, the imprinted resist was removed by lift-off in acetone sonication for 1 min leaving nanopatterned Ag nanocrystal array on the glass substrate. Alternatively, the imprinting procedure in the previous embodiment may be used to imprint Ag NCs electrodes on a thermally oxidized Si substrate. In a particular embodiment, PbSe NCs may be deposited on a substrate with imprinted electrodes and then undergo ligand exchange according to the solid ligand exchange method of flowchart 10.

Ligand exchange of Ag NCs. In one embodiment, a dispersion of Ag NCs underwent a ligand exchange according to the following steps: Chemical treatment was performed after spincasting or nanoimprinting. Exchange was achieved by immersing the NC-coated substrate in a methanol solution containing the new ligand. Non-specifically bound ligands were washed off the surface by immersing the sample in two successive baths of pure methanol and drying it in air. Ethanedithiol was prepared as a 1% (v/v) solution in methanol and exchange was carried out for 3 hours. For $NH_4SCN$ and $NH_4Cl$ the conditions were either 50 mM for 10 min, or 130 mM for 2 min. For potassium hydrogen sulfide the conditions were 50 mM for 10 min.

Resistivity of Ag NC thin films: To determine and compare the conductivity/resistivity of Ag NC thin films, Ag thin films were formed and measured. Multiple Ag NC thin films were formed: one Ag NC thin film capped with EDT ligands, one Ag NC thin film capped with potassium hydrogen sulfide (KHS) ligands, one single layer Ag NC thin film capped with ammonium chloride (NH4Cl) ligands, one three-layer Ag NC thin film capped with NH4Cl ligands, one single layer Ag NC thin film capped with NH4SCN ligands and one three-layer Ag NC thin film capped with NH4SCN ligands. Additionally, a thermally evaporated Ag thin film was formed and measured. The resistivity [$\Omega \cdot cm$] was measured as follows: the KHS capped Ag NC thin films and the single layer NH4Cl capped Ag NC thin films were insulating with a resistivity greater than 1 M$\Omega$, $6[\pm 2] \cdot 10^5$ for EDT capped Ag NC thin films with a thickness of ~130 nm, $12[\pm 5]$ for the three-layer NH4Cl capped Ag NC thin films with a thickness of $370\pm 90$ nm, $150\pm 60$ for the single layer NH4SCN capped Ag NC thin films with a thickness of $180\pm 6$ nm, and $8.8\pm 2$ for the three-layer NH4SCN capped Ag NC thin films with a thickness of $220\pm 20$ nm. The thermally evaporated Ag thin film had a resistivity of $1.9\pm 0.4$ with a thickness of $70\pm 5$. This demonstrates that the three-layer Ag NC thin films treated with NH4SCN ligands have a resistivity of only 5.5 times that of bulk silver.

Figure 12B:
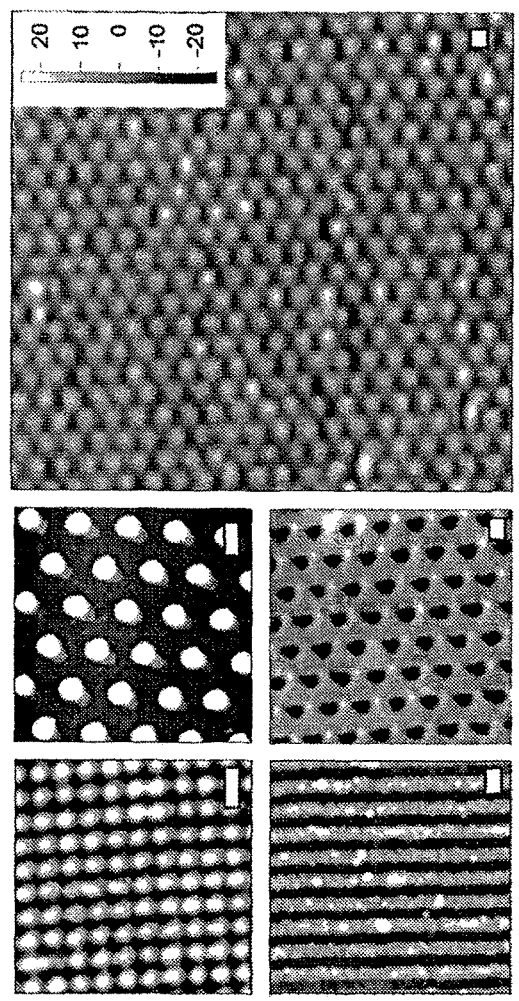
FIG. 12B is a plurality of images of various nanostructures fabricated in accordance with aspects of the invention.
Figure 12A:
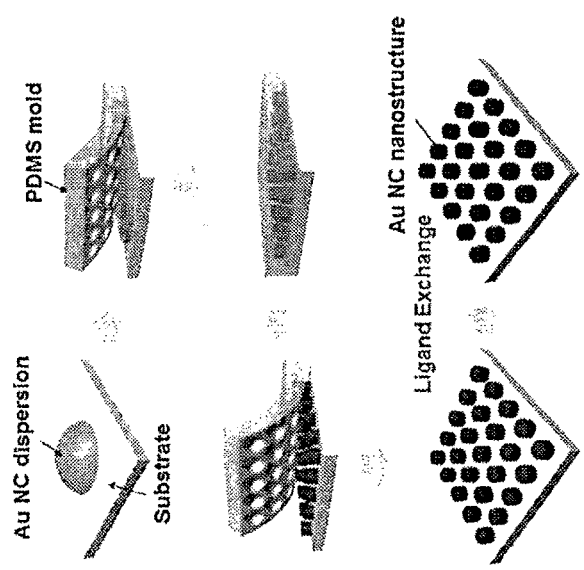
FIG. 12A is an illustration of a schematic for nanoimprinting in accordance with aspects of the invention.

FIG. 12A is a depiction illustrating a schematic of a nanoimprinting method in accordance with this embodiment of the invention. One of skill in the art would understand various methods of nanoimprinting for the description herein.

Figure 12C:
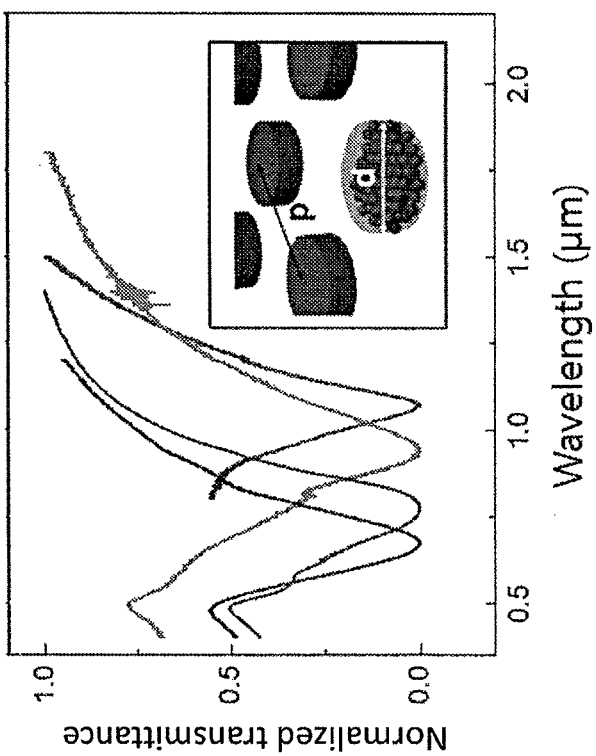
FIGS. 12C and 12D are graphs depicting transmittance spectra of various nanostructures fabricated in accordance with aspects of the invention.
Figure 12D:
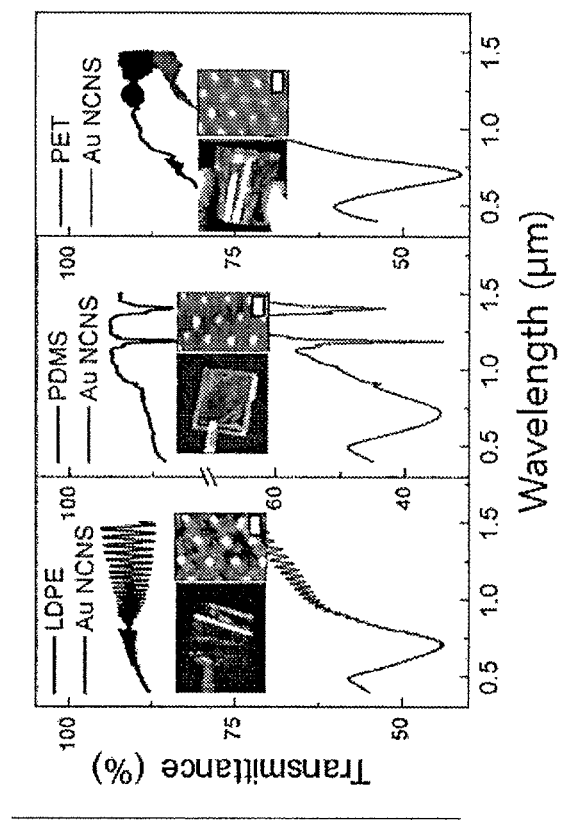

FIG. 12B is a plurality of Atomic Force Microscopy images of examples of nanoimprinted structures composed of Au NCs with SCN-based ligands in accordance with embodiments of the invention. The scale bar is 500 nm and the z-height scale is 40 nm. FIG. 12C is a graph depicting transmittance spectra of nanopillar structures composed of Au NCs with SCN-based ligands with varying pitch, p, and diameter, d, fabricated in accordance with one embodiment of the invention. FIG. 12D is a plurality of graphs depicting transmittance spectra of nanoimprinted nanopillar structures composed of Au NCs with SCN-based ligands fabricated on different flexible substrates in accordance with aspects of the invention. Although various nanostructures composed of Au NCs with SCN-based ligands are depicted in FIGS. 12B-12D, one of skill in the art will recognize how to make non-flexible nanostructures and will understand the materials that may be used to make other flexible and non-flexible nanostructures utilizing the invention from the description herein.

Ligands for use with embodiments of the invention. In accordance with aspects of the invention, ligands that may be used include the following: Chalcogenocyanates: MECN, where M is any cation (e.g., Li+, Na+, K+, NH4+, R4N+, Ca+; R is any alkyl group) and E is any Chalcogen (O, S, Se, Te), e.g. KSCN or NH4SeCN. Halides: MX, where M is any cation (e.g., Li+, Na+, K+, NH4+, R4N+, Ca+; R is any alkyl group) and X is any halide (F—, Cl—, Br— I—). Chalcogenides: ME where M is any cation (e.g., Li+, Na+, K+, NH4+, R4N+, Ca+; R is any alkyl group)and E is any Chalcogenide (O—, S—, Se—, Te—), e.g., K2S or (NH4)2Te. Acetates and formates: MR1COO where M is any cation (e.g., Li+, Na+, K+, NH4+, (R2)4N+, Ca+; R2 is any alkyl group) and R1 is CH3 or H, e.g., NH4CH3COO or HCOONa. Tetrafluoroborates: MBF4 where M is any cation (e.g., Li+, Na+, K+, NH4+, R4N+, Ca+; R is any alkyl group) e.g., NH4BF4. MEH where E is O, NH, S, Se, Te., ethanedithiol (EDT), hydrazine (N2H4), Benzenedithiol (BDT)The specific ligands described are exemplary and not exclusive.

Although aspects of the invention are illustrated and described herein with reference to specific embodiments, the invention is not intended to be limited to the details shown. Rather, various modifications may be made in the details within the scope and range of equivalents of the claims and without departing from the invention.

What is claimed:

1. A method of preparing a dispersion of colloidal nanocrystals (NCs) for use as NC thin films, the method comprising the steps of:

mixing a dispersion of NCs capped with ligands with a solution containing chalcogenocyanate (xCN)-based ligands;

separating the mixture into a supernatant and a flocculate; and dispersing the flocculate with a solvent to form a subsequent dispersion of NCs capped with xCN-based ligands.

2. The method of claim 1, further comprising flocculating the mixture prior to the separating step.

3. The method of claim 2, further comprising repeating the flocculating and separating steps one or more times prior to the dispersing step.

4. The method of claim 1, further comprising washing the flocculate with a non-dispersing solvent prior to the dispersing step.

5. The method of claim 1, wherein the NCs are at least one of cadmium-based, zinc-based, lead-based, gold-based, or silver-based.

6. The method of claim 1, further comprising the step of depositing at least a portion of the subsequent dispersion of NCs capped with xCN-based ligands on a substrate.

7. The method of claim 6, following the depositing step, further comprising the step of patterning the dispersion of NCs on the substrate.

8. The method of claim 6, wherein the substrate is flexible.

9. The method of claim 1, further comprising discarding the supernatant prior to the dispersing step.

10. A method of preparing a dispersion of colloidal nanocrystals (NCs) for use as NC thin films, the method comprising the steps of:

mixing a dispersion of NCs capped with ligands with a solution containing chalcogenocyanate (xCN)-based ligands;

flocculating the mixture;

centrifuging the flocculated mixture until separation of a supernatant and a flocculate;

discarding the supernatant;

adding a solvent to the flocculate; and dispersing the flocculate with the solvent to form a subsequent dispersion of NCs capped with xCN-based ligands.

11. The method of claim 10, further comprising repeating the flocculating and centrifuging steps one or more times prior to the dispersing step.

12. The method of claim 11, further comprising washing the flocculate with a non-dispersing solvent prior to the dispersing step.

13. The method of claim 10, further comprising the step of depositing at least a portion of the subsequent dispersion of NCs capped with xCN-based ligands on a substrate.

* * * * *